United States Patent
Lesso et al.

(10) Patent No.: US 11,604,977 B2
(45) Date of Patent: Mar. 14, 2023

(54) COMPUTING CIRCUITRY

(71) Applicant: Cirrus Logic International Semiconductor Ltd., Edinburgh (GB)

(72) Inventors: John Paul Lesso, Edinburgh (GB); John Laurence Pennock, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 395 days.

(21) Appl. No.: 16/859,140

(22) Filed: Apr. 27, 2020

(65) Prior Publication Data

US 2020/0356848 A1    Nov. 12, 2020

Related U.S. Application Data

(60) Provisional application No. 62/844,305, filed on May 7, 2019.

(30) Foreign Application Priority Data

Sep. 26, 2019  (GB) ..................................... 1913857

(51) Int. Cl.
*G06N 3/04* (2006.01)
*G06N 3/063* (2023.01)
*G11C 13/00* (2006.01)

(52) U.S. Cl.
CPC ....... *G06N 3/0635* (2013.01); *G11C 13/0069* (2013.01); *G11C 2013/0078* (2013.01)

(58) Field of Classification Search
CPC .............. G06N 3/0635; G11C 13/0069; G11C 2013/0078

(Continued)

(56) References Cited

U.S. PATENT DOCUMENTS 9,785,615 B1  10/2017  Merced Grafals et al.
10,825,510 B2 * 11/2020 Jaiswal ................. G11C 11/412
(Continued)

OTHER PUBLICATIONS

Combined Search and Examination Report under Sections 17 and 18(3), UKIPO, Application No. GB1913857.7, dated Feb. 17, 2020.
(Continued)

*Primary Examiner* — Vu A Le
(74) *Attorney, Agent, or Firm* — Jackson Walker L.L.P.

(57) ABSTRACT

This application relates to computing circuitry (200), in particular for analogue computing circuitry suitable for neuromorphic computing. The circuitry (200) has a plurality of memory cells (201), each memory cell having an input electrode (201) for receiving a cell input signal and an output (203$_P$, 203$_N$) for outputting a cell output signal ($I_P$, $I_N$), with first and second paths connecting the input electrode to the output. The cell output signal thus depends on a differential current between the first and second paths due to the cell input signal. Each memory cell also comprises at least one programmable-resistance memory element (204) in each of the first and second paths and is controllable, by selective programming of the programmable-resistance memory elements, to store a data digit that can take any of at least three different values. The plurality of memory cells are configured into one or more sets (205) of memory cells and a combiner module (206) receives the cell output signals from each of the memory cells in at least one set, and combines the cell output signals with a different scaling factor applied to each of the cell output signals.

20 Claims, 7 Drawing Sheets

(58) Field of Classification Search
USPC .......................................................... 706/38
See application file for complete search history.

(56) References Cited

U.S. PATENT DOCUMENTS

| | | | | |
|---|---|---|---|---|
| 11,188,825 | B2* | 11/2021 | Boybat Kara | ......... G06N 3/049 |
| 2017/0017879 | A1* | 1/2017 | Kataeva | ............. G06F 11/0721 |
| 2020/0160160 | A1 | 5/2020 | Kim et al. | |

OTHER PUBLICATIONS

Krestinskaya, Olga et al., "Neuro-memristive Circuits for Edge Computing: A Review", arXiv 1807 00962 v2, [cs ET ] Nov. 28, 2018.

* cited by examiner

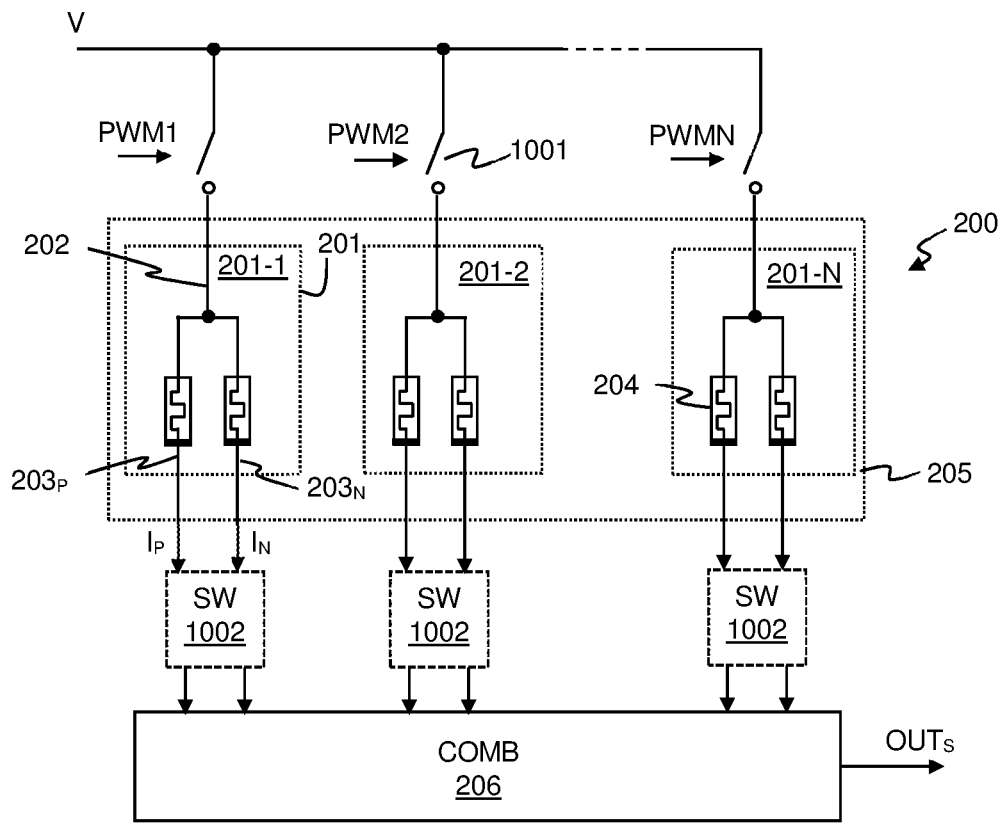
Figure 10
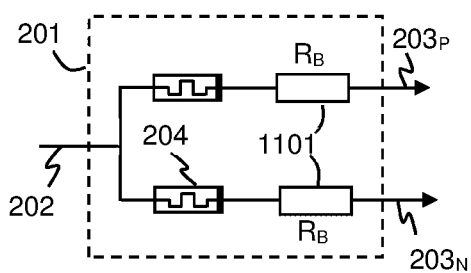
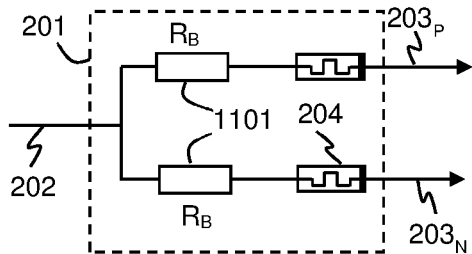
Figure 11a
Figure 11b

COMPUTING CIRCUITRY

FIELD OF DISCLOSURE

The field of representative embodiments of this disclosure relates to methods, apparatus and/or implementations concerning or relating to computing circuitry, for example for neuromorphic computing, and, in particular, to the configuration and operation of cells comprising programmable-resistance memory elements for processing data, and arrays of such cells.

BACKGROUND

There are a number of applications which may, in operation, require a significant amount of computation. Computing is often performed in the purely digital domain using suitable processors, e.g. based on the Von Neumann architecture. There are some applications however where it may be advantageous to perform computation, at least partly, in the analogue domain.

For instance, artificial neural networks (ANNs) are increasingly being proposed for use in a number of different areas, e.g. for classification or recognition purposes. An ANN typically comprises a number of processing nodes or artificial neurons. Each processing node can receive a plurality of data inputs and generate an output based on a weighted combination of the data inputs and a transfer function. Typically the processing nodes may be arranged in layers and the output of a processing node of one layer may be provided to one or more processing nodes of a succeeding layer.

In order to perform a particular task, the ANN is trained using a training data set and the weights applied to the different data inputs by the various processing nodes adjusted. The goal is to determine a set of overall weights such that input data that is known to correspond to a particular defined class is correctly identified as belonging to that class and input data known not to correspond to that defined class is not incorrectly identified as such. For supervised learning, training the ANN requires use of a controlled training data set and requires a significant amount of processing. The ANN is thus typically trained in a centralised way in a suitable computing facility, e.g. a high performance server or the like.

Once trained, the ANN can be used for inference with newly acquired data, e.g. for classification or recognition purposes. In at least some approaches, the trained ANN may be hosted on a centrally accessible computing facility, e.g. a central server, and may receive and process data received from remote devices. For example, to allow for a user of a device such as a smartphone to instruct internet search queries by voice, the speech of the user could be captured by the smartphone and the relevant audio transmitted, possibly after some initial processing to extract features of interest, to an inference engine comprising an ANN trained for speech recognition which is hosted on a data centre. The ANN can then process the received audio to determine the relevant query.

In at least some instances however it may be desirable to implement the ANN for inference in the remote device itself. This may be the case to enable operation where a data connection to a central computing facility is not possible or practical. Additionally, the concept of "edge computing" moves at least some of the computational load from central computing facilities to the "edge devices", such as smartphones, tablet computers etc. that collect the relevant data to be processed. This can significantly reduce the computing burden on the central facilities.

Processing data using a trained ANN, i.e. performing inference, may involve significant computation. For an ANN, the input to each processing node is typically a vector of input variables, and the input vector may have a relatively large number of elements. For at least some ANNs the processing in each processing node effectively involves multiplying the input vector by a matrix of stored weights and then combining the processed results into an output vector. The matrix of stored weights may have a large number of elements, which need to be stored in memory, and the matrix multiplication will involve a large number of calculations. Implementing a trained ANN with a digital processor based on the Von Neumann architecture, would involve the weight values being stored in memory. Performing the computation associated with operating the ANN would thus involve a large number of individual calculations, with memory reads to retrieve the relevant weight value and memory writes to store the result of the individual calculations. The computation would, in general be sequential in each processor core. This means that there may be some computational latency associated with performing the computations necessary for operating the ANN. In some applications, for instance for voice recognition, such latency may be undesirable.

Additionally, especially for portable devices, low power consumption is generally desirable. This is particularly the case where the computing may be performed as part of some function that is provided relatively continuously over a long timescale. For example it may be desirable to allow for an electronic device to be operable in a mode to respond to voice commands issued at any time, without requiring the user to physically interact with the device in any way beforehand. Such "always-on" functionality requires a microphone of the device to be active and for audio detected by the microphone to be analysed, in a substantially continuous manner, to detect any voice activity. The analysis may involve at least some processing of the audio signal which may involve significant computation, e.g. to detect whether a defined trigger word or phrase was spoken and/or to determine whether the voice activity corresponds to a registered user of the device. Implementing such processing using a conventional digital processor may require a digital processing chip to be active relatively continuously, which may result in an undesirable amount of power consumption.

SUMMARY

Embodiments of the present disclosure relate to methods, apparatus and systems for computing that at least mitigate at least some of the above mentioned issues.

According to an aspect of the disclosure there is provided computing circuitry for neuromorphic computing comprising:
  a plurality of memory cells, each memory cell comprising:
   an input electrode for receiving a cell input signal;
   an output for outputting a cell output signal;
   first and second paths connecting the input electrode to the output so that the cell output signal, in use, depends on a differential current between the first and second paths due to the cell input signal, wherein the memory cell comprises at least one programmable-resistance memory element in each of the first and second paths, wherein each memory cell is controllable by selective programming of the programmable-resistance memory elements of that memory cell to store a data digit that can take any of at least three different values;

wherein the plurality of memory cells are configured into one or more sets of memory cells, a combiner module configured to receive the cell output signals from each of the memory cells in at least one set and to combine the cell output signals with a different scaling factor applied to each of the cell output signals.

In some examples at least some of the programmable-resistance memory elements comprise memristors.

In some examples the different scaling factor applied to each of the cell output signals of a set differ from one another by a factor of three. In some examples the circuitry may further comprise a programming controller for controlling programming of the plurality of memory cells. The programming controller may be configured to programme the memory cells of a set according to a ternary coding scheme. The combiner module may be configured to combine the cell output signals such that scaling factors applied to each of the cell output signals of a said set of memory cells are ternary weighted.

In some examples each memory cell comprises a first programmable-resistance memory element in the first path and a second programmable-resistance memory element in the second cell path. The programming controller may be configured to programme the memory cells to any of:
 a first cell state, in which the first programmable-resistance memory element is programmed to a low resistance state and the second programmable-resistance memory element is programmed to a high resistance state;
 a second cell state, in which the first programmable-resistance memory element is programmed to the high resistance state and the second programmable-resistance memory element is programmed to the low resistance state; or
 a third cell state, in which both the first and second programmable-resistance memory elements are programmed to the same one of either the low resistance state or the high resistance state.

In some examples the combiner module comprises a resistor ladder arrangement comprising a plurality of rungs, each rung having an input node configured to receive a current signal comprising the cell output signal of one of the memory cells of a said set of memory cells and also a current contribution from any preceding rungs and configured such that a defined proportion of the total current at the input node flows to the input node of the successive rung to provide said different scaling factors. A transimpedance amplifier may be configured to receive an output of the resistor ladder arrangement.

In some examples the combiner module may comprise an integrator having an integrator capacitor. The integrator may be configured to operate in a sequence of phases, comprising a plurality of charging phases in which the integrator is configured to receive a current signal comprising the cell output signal of a different one of the memory cells of a said set of memory cells to accumulate charge on the integrator capacitor, and a plurality of charge sharing phases in which the integrator capacitor is connected in parallel with a charge sharing capacitor to transfer a defined proportion of charge away from the integrator capacitor to provide said different scaling factors.

In some examples the combiner module may comprise at least one controlled oscillator configured to receive inputs comprising the cell output signals of the memory cells of a said one of the sets and counter configured to count a number of oscillations in an output of the controlled oscillator in a count period, wherein the combiner module is configured to apply different count periods for the different memory cells to provide said different scaling factors.

In some examples the cell input signal for each cell of a set of memory cells may comprise an analogue data signal.

In some examples the cell input signal may comprise a digital data signal, where the signal level of the digital data signal quantised to one of a plurality of predefined data levels to represent a data digit value. The digital data signal may be ternary encoded. The computing circuitry may comprise a converter for receiving input data in a first digital format and converting said input data to the ternary encoded digital data signal.

The computing circuit may be configured such that digits of a multi-digit data value of the digital data signal are applied sequentially to a set of memory cells as the cell input signal. In which case the combiner may be configured to combine the cell output signals to form a weighted sum for each data digit, and to combine the weighted sums for each data digit with a different gain weighting for each data digit.

In some implementations the computing circuitry may comprise a plurality of such sets of memory cells. The computing circuitry may be configured such that different digits of a multi-digit data value of the digital data signal are applied in parallel to a first plurality of said sets of memory cells, where each of the first plurality of sets of memory cells are programmed to store the same value. The combiner may be configured to combine the cell outputs from the memory cells of the first plurality of sets with a scaling factor applied to each of the cell output signals that depends on the significance of the memory cell in the stored data value and the significance of the data digit in the multi-digit data value.

In some implementation there may be at least one group of a plurality of sets of memory cells where, for each of sets in a group, a respective cell input signal is applied to the memory cells of the set; and the plurality of sets of memory cells in a group are connected so that the combiner module receives a combined cell output signal from corresponding memory cells of each of the sets in said group.

There may, in some examples, be a plurality of such groups. The computing circuitry may be configured such that, each of the sets of a group has a corresponding set in each of the other groups and the cell input signals applied to each corresponding set is based on the same input data value.

The computing circuitry may be implemented as at least part of an artificial neural network. In another aspects therefore there may be an artificial neural network apparatus comprising computing circuitry according to any of the variants described herein.

Aspects also relate to an electronic device comprising computing circuitry according to any of the variants described herein. The device may be at least one of: a battery powered device; a portable device; a communications device; a smartphone; a computing device; a laptop, notebook or tablet computing device; a wearable device; a smartwatch; a voice controlled or activated device; a smart speaker; a domestic appliance.

In another aspect there is provided a computing apparatus comprising:
 a plurality of memory cells, each memory cell comprising first and second programmable-resistance memory element for collectively storing a data digit and outputting a cell output signal proportional to the stored digit for that memory cell wherein the data digit may take any of at least three different values;

wherein the plurality of memory cells are configured into at least one set for storing a multi-digit data value; and a combiner module for receiving the cell output signals from the memory cells of the at least one set and combining the cell outputs from each memory cell with a predetermined scaling factor.

In a further aspect there is provided an analogue computing apparatus comprising:

a computation block configured to perform a calculation based on at least a first data value and at least a second data value and generates a computation output signal with a current or voltage indicative of the calculation;

a controlled oscillator configured to receive the computation output signal and generate an oscillation signal with a frequency that varies with the computation output signal; and an extract block that determines an output value based on the phase or frequency of the oscillation signal.

In some examples the computation block may be configured to perform a dot-product calculation between a first vector of data values and a second data of input values. The first vector of data values may correspond to input data, for example input data to be processed, which may or may not have been processed by some preceding computational block, e.g. a previous layer of an ANN. The second vector of data values may correspond to weight values. The computation output signal may be a current signal, with a current indicative of the calculation, or a voltage signal, with a voltage indicative of the calculation. In some instances, the instantaneous magnitude of the computation output signal may correspond to the calculation. In which case the extract block may determine the output value based on the frequency of the oscillation signal. In some instances, the magnitude of the computation output signal may vary over the course of a cycle period and the average or integrated magnitude over the period correspond to the value of the calculation. In which case the extract block may determine the output value based on the phase of the oscillation signal.

The controlled oscillator may be a controlled ring-oscillator, but any type of oscillator such as an asynchronous delta-sigma modulator may be used in other implementations.

Unless expressly indicated to the contrary, any of the various features of the various implementations discussed herein may be implemented together with any one or more of the other described features in any and all suitable combinations.

BRIEF DESCRIPTION OF THE DRAWINGS

For a better understanding of examples of the present disclosure, and to show more clearly how the examples may be carried into effect, reference will now be made, by way of example only, to the following drawings in which:

FIG. 10 illustrates a further example of computing circuitry according to an embodiment;

FIGS. 11a to 11c illustrate other example memory cells;

DETAILED DESCRIPTION

Figure 1:
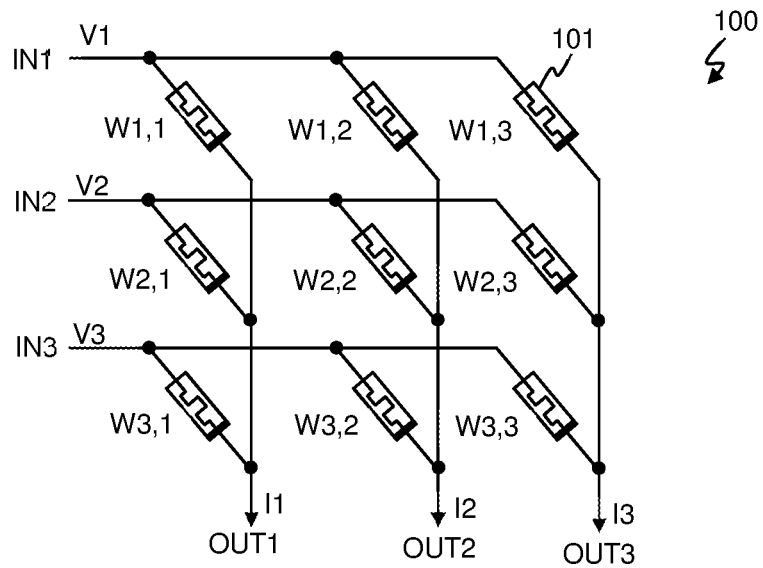
FIG. 1 illustrates the principles of a memristor crossbar array.

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

As noted above artificial neural networks (ANNs) are one example of an application that may involve significant computation, for instance matrix multiplication, during operation and, for which, conventional digital processing based on the Von Neumann architecture may have disadvantages in terms of processing throughput and/or power consumption.

It has been proposed that at least some of the computation associated with an ANN, e.g. when using the ANN for inference, may be implemented using computing in the analogue domain. For instance, neuromorphic computing may use at least some analogue or mixed-signal circuitry that can implement a model of a neural system, e.g. an ANN. Neuromorphic computing circuitry has been proposed, for instance, using a crossbar array comprising elements whose resistance, or equivalently, conductance, may be programmed to a selected state, for example memristors.

The term memristor is used herein to refer to an electronic element that has a variable resistance which can be controlled and varied and which has some memory such that a particular resistance state persists in the absence of applied power. Binary memristor elements have been proposed, for instance based on MRAM (Magnetoresistive random-access memory) or ReRAM (Resistive random-access memory), that can exhibit either a high resistance state or a low resistance state and can be selectively programmed to operate in the desired state, for instance by applying suitable programming voltages. The programmed state may persist, in the absence of any applied power, and thus the memristor can be seen as non-volatile memory which can be read by determining whether the element is in the high resistance or the low resistance state. An individual MRAM or ReRAM or memristor element may thus be used as a binary memory element.

Memristor crossbar arrays have been proposed for use as memory arrays. Such arrays may have a plurality of first electrodes arranged to overlap with a plurality of second electrodes, e.g. row electrodes and column electrodes. Each of the row electrodes is coupled to each of the second electrodes, e.g. column electrodes via a respective memristor. To programme the array, suitable programming voltage pulses may be applied to each of the column electrodes, with a write voltage applied to one of the row electrodes, so as to create a resultant voltage to suitably program each of the memristors associated with that row. The other row electrodes may be held at a voltage level such that the resultant voltage experienced by the memristors of these other row is insufficient to change the resistance state of the memristor. The array may be programmed in this way, row by row. Once programmed, the memory can be read out, row by row, by applying a read pulse to the relevant row and monitoring each column to determine the resistance state of the relevant memristors.

It has been proposed that a memristor crossbar array of this type could also be used to provide some computation. FIG. 1 illustrates the principle. FIG. 1 illustrates a three-by-three crossbar array 100 with, in this example, three row electrodes arranged as inputs IN1, 1N2, 1N3 and three column electrodes arranged as outputs OUT1, OUT2, OUT3. It will be understood however that the principle could apply to a different number of inputs and/or outputs and the number of inputs could be different from the number of outputs. Each input is connected to each output via a respective memristor 101.

In the example of FIG. 1, input data may be provided to each input of the array as a respective voltage level, V1, V2, V3. Each output will provide a respective output current I1, I2, I3. A given output will receive a contribution of current from each input, where the respective current contribution depends on the respective voltage at that input and the resistance state of the relevant memristor. Simplistically, if each output were considered to be held at ground or be a virtual earth, the current contribution at a given output k from a given input j will be equal to the voltage Vj at input j multiplied by the conductance Gj,k of the memristor linking input j to output k (and where the conductance Gj,k is the inverse of the resistance of the relevant memristor, i.e. Gj,k=1/Rj,k where Rj,k is the resistance of the relevant memristor). In this example a given output thus receives a contribution to the overall current output current from each input, where the current contribution is equal to the product of the voltage at that input and the conductance of the relevant memristor. The overall current output may be regarded as representing the dot product Gk·V=ΣGj,k·Vj of a vector V comprising the set of voltages Vj with a vector Gk comprising the set of conductances (Gj,k; j=1 . . . ).

The conductance Gj,k of the memristor, i.e. 1/Rj,k, can thus be seen as a weight Wj,k applied to the data at input j for output k. If suitable data is applied simultaneously to multiple inputs, the output current at a given output is a sum of the weighted contributions from the various inputs. This output current could be processed as an analogue current variable or converted into a corresponding voltage. It can therefore be seen that the crossbar array illustrated in FIG. 1 performs simultaneous dot product calculations for the various input data values with stored weight values, without requiring a separate memory read process and automatically provides a sum of the relevant weighted input values for a given output.

It will be understood that in the example of FIG. 1 there is a single two-level memristor connecting each input to each output and, as such, the stored weight may take only two different values. In practice it may be desirable to provide a greater resolution for the different weighing values. Additionally the arrangement illustrated in FIG. 1 only allows for a unipolar weighting. In some applications it may be desirable to provide bipolar weightings, i.e. for weightings to have positive or negative values.

Embodiments of the present disclosure relate to methods, apparatus and/or implementations concerning or relating to computing circuitry comprising programmable-resistance memory elements. In particular, embodiments relate to circuitry cells comprising programmable-resistance memory elements, such as memristors or the like, for storing and processing multilevel data values, e.g. multilevel weighting values. At least some embodiments relate to circuitry for storing a multilevel data value with ternary encoding. In some embodiments the multilevel data value may be stored as a bipolar value.

Figure 2:
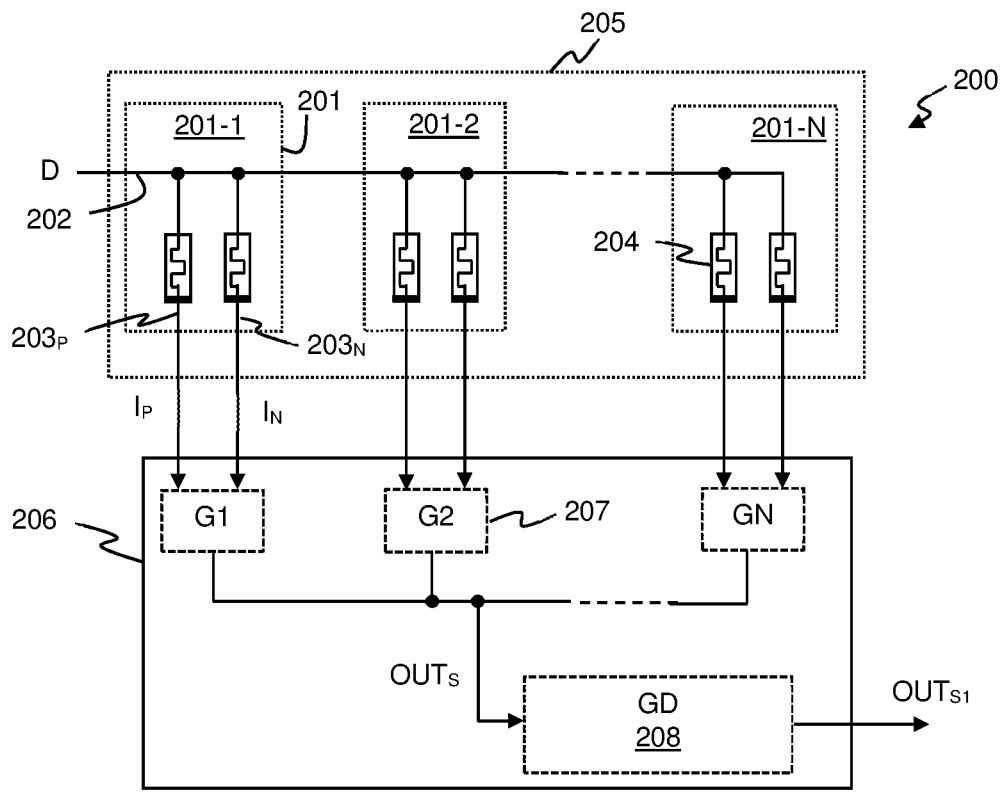
FIG. 2 illustrates one example of computing circuitry according to an embodiment.

FIG. 2 illustrates one example of computing circuitry 200 according to an embodiment. The computing circuitry 200 comprises a plurality of memory cells 201.

Each memory cell 201 comprises a first electrode 202 for receiving, in use, a defined cell input signal. In the example of FIG. 2 the cell input signal is defined by an input data value D and may, for instance, be a defined voltage with a level that depends on the input data, although in some embodiments it could instead be a defined current. Each memory cell 201 also comprises two second electrodes $203_P$ and $203_N$ for allowing a differential current to flow. The second electrodes $203_P$ and $203_N$ will be referred to herein as positive and negative electrodes respectively, although it will be understood that this does not imply anything about any direction of current flow in either electrode. The first electrode 202 is coupled to each of the two second electrodes $203_P$ and $203_N$ to provide first and second paths. The memory cell 201 also comprises at least one programmable-resistance memory element 204 with a programmable resistance, i.e. an element which can be selectively controlled to adopt one of a plurality of different states, where each state exhibits a different resistance or conductance, and the selected state persists once programmed (at least for a period of time sufficient to perform computing and/or until the element is reprogrammed).

Embodiments will be described herein where the programmable-resistance memory elements 204 are memristors. As described above memristors, for instance based on MRAM or ReRAM technology are known and may be implemented. However there may be other types of programmable-resistance memory elements that could be used for at least some of the programmable-resistance memory elements. For instance the programmable-resistance memory elements could comprise or be based on flash-based memory e.g. floating-gate technologies such as ESF3, charge-trap technologies such as Silicon-Oxide-Nitride-Oxide-Silicon technologies (SONOS), fuses (polysilicon or metal), carbon nanotubes or some non-memristive MRAM technologies such as spintronic technology.

In this example each of the first and second paths of a memory cell 201 comprises a respective memristor 204. In the example of FIG. 2 the memristor 204 in the first path of a memory cell is preferably the same, i.e. has substantially the same structure and properties, as the memristor in the second path of the memory cell. In other words the first path and the second path preferably comprise substantially identical components. Each memristor 201 is capable of being programmed so as to exhibit a selected one of at least two different values of resistance, e.g. a first resistance value or a second resistance value, different from the first resistance value. As used in this disclosure the terms high resistance state and low resistance state may be used to distinguish between different resistance states that a memristor may be programmed into, and it will be understood that the terms high and low are used relatively and do not limit to any particular absolute values of resistance. The memristors 204 may be two level memristors that may be programmed to two different resistance states, although memristors that are capable of being programmed to more than two different resistance values could be used in some embodiments.

The memory cells 201 are arranged into at least one set 205 having a defined number, N, of memory cells 201, i.e.

each set comprises memory cells 201-1 to 201-N. In the example of FIG. 2 there is just a single set, but in some embodiments there may be multiple sets as will be described in more detail later. The memory cells 201 of the set 205 may have substantially identical components to one another. Each of the memory cells of the set is arranged to receive the same data input, i.e. all the memory cells 201 of the set 205 receive the data D as a cell input signal. In the example illustrated in FIG. 2 there is a common electrode which serves as a common first electrode 202 for all of the memory cells 201 in a set 205, but other arrangements are possible, for instance the first electrodes of each memory cell could be connected to a common electrode e.g. a data bus.

In one example, a voltage on the first electrode 202 of a memory cell due to the input data D will cause a current to flow in the first and second paths and hence also the positive and negative second electrodes $203_P$ and $203_N$ of that memory cell. The current that flows via each path will depend on the conductance of the respective path, which depends, at least partly, on the conductance of the respective memristor 204.

Each memory cell may thus generate a differential current which depends on the conductance, or equivalently, the resistance states, of the memristors 204 of the memory cell, but which may, in at least some states of the memory cell, also be proportional to the voltage at the first electrode 202 due to the data D. Each memory cell has a cell output for outputting a cell output signal which depends on the differential current in the first and second paths. In the example of FIG. 2 the output is a differential output and thus comprises the positive and negative electrodes $203_P$ and $203_N$ and the cell output signal comprises the current components $I_P$ and $I_N$ from each memory cell. In some embodiments however the current components in the first and second paths may be combined to give a resultant cell output signal which could then be output via a single output electrode.

In embodiments of the disclosure, the programmable-resistance memory elements 204, e.g. memristors, of a memory cell 201 can be programmed to store and represent defined data values, e.g. weight values.

For instance, consider a single memory cell, say memory cell 201-1. If the voltage at the first electrode 202 due to the input data is VD, and assuming that the positive and negative second electrodes $203_P$ and $203_N$ are each effectively coupled to ground or a virtual earth, the current $I_P$ flowing in the first path to the positive electrode $203_P$ will (ignoring losses etc.) be equal to $V_D/R_P$ where $R_P$ is the resistance of the first path and the current $I_N$ flowing in the second path to the negative electrode $203_P$ will be equal to $V_D/R_N$ where $R_N$ is in the second path.

The differential current $\Delta I = I_P - I_N$ can thus be seen as:

$$\Delta I = I_P - I_N = V_D/R_P - V_D/R_N = V_D \cdot [(R_N - R_P)/R_P \cdot R_N] \qquad \text{Eqn. (1)}$$

It can be seen that the differential current is proportional to the voltage $V_D$ determined by the input data, i.e. the cell input signal. The differential current also depends on the resistances of the first and second paths of the memory cell. The memristors in the first and second paths may be programmed to provide desired resistances in the first and second paths to encode a data value. In particular a memory cell 201 may be programmed to a selected cell state to encode a predefined data value.

For example, in a first cell state the memristor in the first path may be programmed to a low resistance state, with a resistance $R_L$, and the memristor in the second path may be programmed to a high resistance state, with a resistance $R_H$. In this cell state the memory cell will preferentially steer current to the positive electrode $203_P$ and, if the memristors were assumed to be the only significant resistance in the relevant paths, the differential current would be given by:

$$\Delta I = I_P - I_N = V_D \cdot [(R_H - R_L)/R_H \cdot R_L] \qquad \text{Eqn. (2)}$$

In a second cell state the memristors may be programmed into the opposite state, i.e. with the memristor in the first path programmed to the high resistance state and the memristor in the second path programmed to the low resistance state. In this case the differential current will be given by:

$$\Delta I = I_P - I_N = V_D \cdot [(R_L - R_H)/R_H \cdot R_L] \qquad \text{Eqn. (3)}$$

It will be seen therefore that the first and second cell states provide differential currents $\Delta I$ of equal magnitude and opposite polarity for a given data input.

The differential current in the first and second cell states can thus be seen as:

$$\Delta I = I_P - I_N = \pm V_D \cdot A_R \qquad \text{Eqn. (4)}$$

where $A_R$ is effectively a constant that depends on the high and low resistance values for the memristors. The first cell state can thus be seen as encoding a data value of +1 and the second cell state can be seen as encoding a data value of -1.

To implement a multilevel data value, e.g. a weight value that can take any of more than two different values, the same data input D (e.g. the defined voltage $V_D$) may be applied to all of the memory cells 201 of the set 205 and the contributions from each of the memory cells in the set, i.e. the respective cell output signals, may be scaled by an appropriate scaling factor or weighting and combined to form a combined output $OUT_S$ which represent the weighted sum of the cell output signals from each of the memory cells in the set(s).

In the example of FIG. 2, the differential current from each memory cell 201 in the set 205 is supplied as the cell output signal to a combiner module 206 which comprises at least one element 207 that can apply a scaling factor, e.g. effectively a gain, to the output signal from a memory cell as part of the combination. For instance FIG. 2 illustrates that a gain G1 may be applied to the output of the memory cell 201-1, a gain G2 may be applied to the output of the memory cell 201-2 and so on with a gain GN being applied to memory cell 201-N. The gains G1 to GN are selected to provide a desired weighting to the contribution from each memory cell to the combined output $OUT_S$.

For instance, if each memory cell 201 were selectively programmed to one of the first cell state or the second cell state discussed above, i.e. to represent a data value of +1 or -1, the gains G1 to GN could be binary weighted. That is, the gain or scaling factors applied to the cell outputs of successive memory cells in the set could differ from one another by a factor of 2. For example the gain G2 could be equal to 2*G1 and the gain GN could be equal to $2^{(N-1)}$*G1. Thus, if the gain G1 were equal to unity say, the differential current contribution from the first memory cell 201-1 would, from equation (4), be $\pm V_D \cdot A_R$, with the polarity being dependent on the selected cell state. Likewise the differential current contribution from the second memory cell 201-2, with the gain G2 applied, would be $\pm 2V_D \cdot A_R$ and so on with the current contribution from the Nth memory cell 201-N being $\pm 2^{(N-1)} V_D \cdot A_R$.

The combination of the suitably gain weighted cell output signals of each memory cell in the set would thus be proportional to $V_D$, defined by the input data, and also a factor W, where the factor W depends on the cell states of the memory cells of the set 205. The factor W in this example can be programmed to $2^N$ different values, which vary between $+(2^N-1)*A_R$ to $-(2^N-1)*A_R$ in steps of $2A_R$. Each memory cell 201 could thus be seen a bit cell for storing one bit of a multibit weight value, with the set 205 of memory cells storing an N-bit data word, e.g. an N-bit weight value. In this example, the memory cell 201-1, to which the lowest gain is applied, can be seen as the least significant bit (LSB) and the memory cell 201-N to which the largest gain is applied can be seen as the most significant bit (MSB).

In embodiments of the present disclosure however, the memory cells 201 of a set 205 may be programmed according to a ternary encoding, that is each memory cell 201 may be programmed to represent a selected one of three different data values. Thus the memory cells 201 may additionally be programmed to another cell state, in which the memristors 204 of the first and second paths are programmed to the same one of the high resistance state or the low resistance state. For example the memory cell 201 may be programmed to a third cell state, in which the memristors in both the first and second paths are in the high resistance state and/or a fourth cell state, in which the memristors in both the first and second paths are in the low resistance state. If the memristors 204 in the first and second paths of the memory cell are in the same state as one another, the current flowing through the memory cell will be steered substantially equally to the positive and negative second electrodes $203_P$ and $203_N$. This will provide a differential current $\Delta I$ of zero. The third or fourth cell states may thus be used to represent a zero data state.

Thus each memory cell 201 could be selectively programmed to the first cell state to represent a data value of +1, programmed to the second cell state to represent a data value of −1 or programmed to the third cell state to represent a data value of 0. The memory cell may additionally or alternatively be programmed to the fourth cell state to represent the data value of 0. In this case the gains G1 to GN may be weighted according to a ternary weighting, i.e. the gains may differ from one another by a factor of three. For example the gain G2 may be equal to 3*G1 and the gain GN may be equal to $3^{(N-1)}*G1$. In this way, if the gain G1 were unity, the contribution from the first memory cell 201-1 to the combined output $OUT_S$ may be $\pm V_D \cdot A_R$ or zero, depending on the selected cell state, the contribution from the second memory cell 201-2 may be $\pm 3V_D \cdot A_R$ or zero, and the contribution from the Nth memory cell 201-N may be $\pm 3^{(N-1)}*V_D \cdot A_R$ or zero.

Again the combination of the suitably gain weighted cell outputs of each memory cell in the set would thus be proportional to $V_D$, defined by the input data, and also the factor W, where the factor W depends on the cell states of the memory cells of the set 205. In this case, however, the factor W can take any of $3^N$ different values that can vary between $+((3^N-1)/2)*A_R$ to $-((3^N-1)/2)*A_R$ in steps of $A_R$.

The use of ternary encoding, rather than binary encoding, as would be normal for most digital processing schemes, reduces the number of memory cells 201 required in each set in order to store a weight value W of a given resolution. For instance, if it is desired to store a weight value which can take any of say 64 different values, then for binary encoding schemes this would require 6-bit encoding, i.e. the set 205 of memory cells would need to have six different memory cells 201. However for a ternary encoding scheme the same resolution of weight value could be achieved with 4-trit (ternary digit) encoding. Thus with ternary encoding the set 205 of memory cells would only need four memory cells 201. This represents, in this example, a reduction in the number of memory cells required by a factor of a third compared with binary encoding. In some implementations, for instance when implementing an ANN, there may be a large number of weight values to be stored. Thus a significant reduction in the number of memory cells 201 required to store the weight values can allow for a significant saving in circuit area required and also power consumption during operation.

In the example of FIG. 2 the gain is applied to the cell output signal from a memory cell 201, e.g. the differential output current. In the example of the FIG. 2 the positive and negative electrodes $203_P$ and $203_N$ together provide a differential output for a memory cell 201 and thus the differential output signal comprises individual current components $I_P$ and $I_N$. In which case, for each memory cell 201, the same gain could be applied to each of the current components separately, i.e. the current component $I_P$ from the memory cell 201-1 may be subject to a gain G1 and separately the current component $I_N$ from memory cell 201-1 may also be subject to a gain G1. In some embodiments however the current components $I_P$ and $I_N$ from the first and second electrodes could be combined to form a resultant cell output signal and the gain could be applied to the resultant cell output signal.

In some embodiments the gain could be applied so as to provide a gain adjusted current signal for combination with gain adjusted current signals from the other memory cells 201 of the set 205. In some embodiments however the gain could be applied as part of the combination of the output signals of the memory cells, or as part of a conversion of a cell output current signal into some other type of signal. The gain may be applied as a gain to the instantaneous level of the signal, or the average level of the signal over a period. For instance the gain could be applied as some time encoding modulation of the relevant signal, e.g. by a PWM type modulation.

Note, as used herein the term gain is used to refer to a scaling factor, that could be applied in any way. This could be an amplification, e.g. multiplication by a factor greater than unity, or an attenuation, e.g. multiplication by a factor less than unity (but for the purposes of the discussion herein the terms higher and lower, or greater and lesser or similar in relation to the gain shall mean a greater magnitude of scaling factor or a lower magnitude of scaling factor. That is, a gain of $^2/_{10}$ will be seen as greater than a gain of $^1/_{10}$ (even though applying a scaling factor of $^1/_{10}$ may be seen as applying a greater degree of attenuation than applying a scaling factor of $^2/_{10}$).

Figure 3:
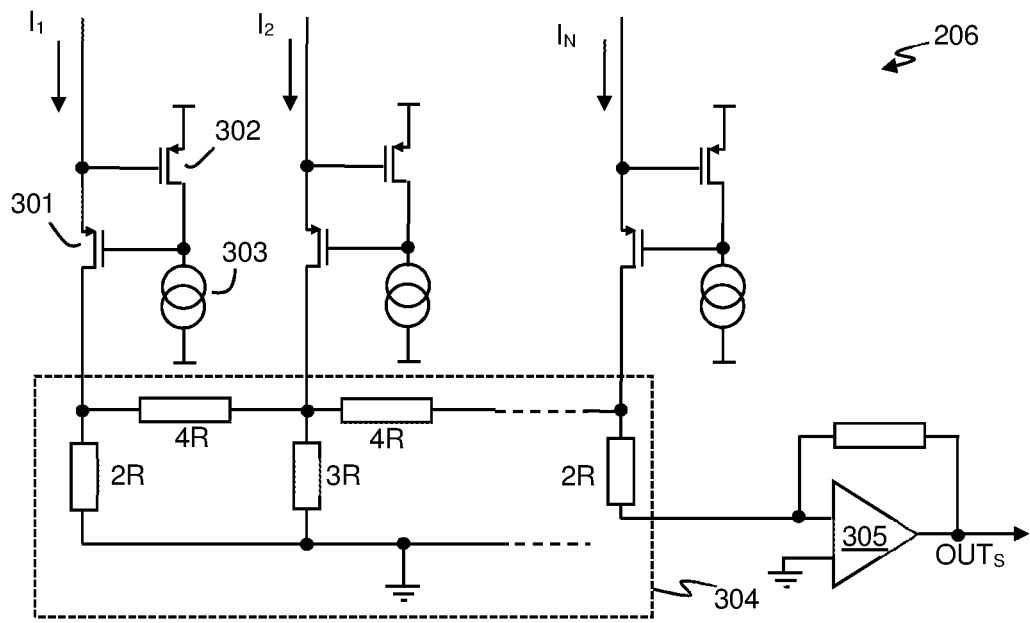
FIG. 3 illustrates one example of circuitry for a combiner module.

FIG. 3 illustrates one example of at least part of a combiner module 206 for producing a weighted sum, $OUT_S$, of the output signals of the memory cells 201 of a set 205 in response to a given input data value. FIG. 3 illustrates that current signals $I_1$ to $I_N$ from the N memory cells in the set may be received by the combiner module. In some embodiments these current signals could be a corresponding one of the current components from each of the memory cells, e.g. the positive current contribution $I_P$ from each of the memory cells 201 of the set 205. In which case the negative current components $I_N$ from each of the memory cells may be received by an equivalent circuit to form a corresponding weighted sum of the negative current components. Alternatively, as discussed above the current components could be processed to form a resultant current for each memory cell which provide the input signals $I_1$ to $I_N$.

Each input current $I_1$ to $I_N$ for the combiner module 206 may be received by a regulated cascode arrangement comprising transistors 301 and 302 and current source 303 as will be well understood by one skilled in the art, to provide a low input impedance, although it will be understood that other low input impedance arrangements are possible. The current signals are then supplied to a resistor divider arrangement or resistor ladder 304 which forms part of a signal path to, in this example, a transimpedance amplifier 305. The resistor ladder has multiple rungs and each rung of the ladder has an input node for receiving one of the input currents $I_1$ to $I_N$ and (for all but the first rung) a current contribution from the preceding rungs. The resistances of the resistor ladder are configured so that a third of the current at the input node is supplied to the next rung. For example the resistor ladder is arranged such that, for the first rung, a resistance (4R) in the output signal path is twice a resistance (2R) to ground, and for each subsequent rung the resistance (3R) to ground is three quarters of the resistance in the forward signal path. The ladder is terminated by another double-resistance (2R) resistor. In effect each stage of the resistor ladder applies an effective gain factor of ⅓.

In this example the output current from the ladder is supplied to the transimpedance amplifier 305. The effective gain for this current component is thus effectively unity. For the current component $I_1$ from the first memory cell 201-1 (as output from the relevant cascode), the current contribution will be reduced by a third in each rung, and thus an effective gain of $⅓^{(N-1)}$ will be applied. It will thus be clear that the gain applied to the current from each memory cell in the set is weighed by a gain that varies by a factor of three for successive memory cells.

In the example of FIG. 3 the weighted sum of the currents is provided to a transimpedance amplifier 305 to generate a voltage output, although other arrangements are possible, such as monitoring the voltage at the other end of the 2R termination resistor with a suitably high input impedance amplifier to generate a buffered output voltage.

Figure 4:
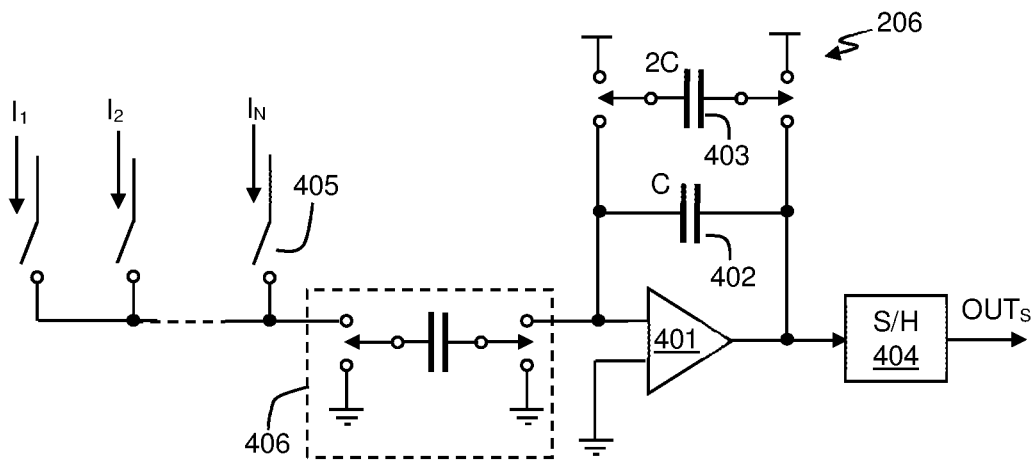
FIG. 4 illustrates another example of circuitry for a combiner module.

FIG. 4 illustrates another example of at least part of a combiner module 206 for producing a weighted sum, $OUT_S$, of the output signals of the memory cells 201 of a set 205. In this example the received current signals $I_1$ to $I_N$ are applied sequentially to an integrator, formed by amplifier 401 and integrator capacitor 402. The integrator operates in multiple phases so that, for each current signal the integrator capacitor 402 is charged by the relevant current signal in one phase and then, for all but the last current signal from the last memory cell of the set, the accumulated charge on integrator capacitor 402 is shared with a charge sharing capacitor 403 in a subsequent phase, so as to transfer a defined proportion of the accumulated charge from the integrator capacitor 402 to the charge sharing capacitor 403.

For example, during a first phase the current signal $I_1$ may be applied to the integrator for a defined duration (with the charge sharing capacitor 403 disconnected) to charge the integrator capacitor 402. For the purposes of this explanation it will be assumed that the current signal $I_1$ is applied directly to the integrator during the first phase, although in some embodiments there may be an input capacitor 406 which is used to provide the input to the integrator as will be discussed in more detail below. The accumulated charge on the integrator capacitor 402 at the end of the first phase will thus depend on the relevant current signal $I_1$. In a second phase, charging of the integrator capacitor 402 is suspended, i.e. no input current is supplied to the integrator, and the charge sharing capacitor 403 is connected in parallel with the integrator capacitor 402. The capacitance of the charge sharing capacitor 403 is configured with respect to that of the integrator capacitor 402 such that, during the charge sharing phase, two thirds of the accumulated charge on the integrator capacitor 402 is transferred to the charge sharing capacitor 403. Thus the charge stored on the integrator capacitor 402 will effectively be reduced by a factor of three.

At the end of the second phase, the charge sharing capacitor 403 is disconnected from the integrator capacitor 402 and connected to reference voltages so as to discharge. Meanwhile the integrator capacitor 402 may be charged for the same defined time period by the next current signal $I_2$ so as to add an amount of charge that depends on the second current signal $I_2$. After the defined period, charging of the integrator capacitor 402 is again suspended and the charge sharing capacitor reconnected in parallel, so as to again transfer two thirds of the accumulated charge away from the integrator capacitor 402. This process is repeated until the last current signal $I_N$. The current signal $I_N$ may be supplied to charge the integrator capacitor 402 for the defined period, but at this stage there is no need for a charge sharing phase (although one could be implemented if desired). The integrator output at this point can be used as the weighted sum of the outputs of the memory cells, for example a sample and hold circuit 404 may sample the integrator output at this point to provide an output $OUT_S$ which is the weighted sum of the current signals.

This operation means that the contribution due to each current signal $I_1$ to $I_N$ will be scaled by a factor of a third with respect to the contribution of the succeeding current signal.

During the phase in which the integrator capacitor 402 is charged by the relevant current signal, the relevant current signal could be selected and supplied as an input to the integrator, e.g. by operating suitable input select switches 405. In some embodiments however the relevant current signal, e.g. $I_1$, may be used to charge the input capacitor 406 during one phase, with the input capacitor 406 then being subsequently connected to the input of the integrator during the charging phase of the integrator.

Again the circuitry illustrated in FIG. 4 may be used to provide a weighted sum for the positive current components $I_P$ from each memory cell in the set, with an additional corresponding circuit being configured to generate a weighted sum of the negative current components $I_N$. Alternatively, as discussed above, the current components could be combined to provide a resultant current signal from each memory cell before being input to the combiner, in which case just one integrator circuit may be implemented.

In some embodiments however, where the cell output signals from the memory cells 201 comprise separate positive and negative current components, the positive and negative current components could be supplied as separate inputs to the same integrator circuit. The positive and negative components could be supplied sequentially, for instance the integrator could be operated in an additional phase such that the positive current component from a given memory cell is applied with a first polarity for the defined time period in one phase and then the negative current component from that same memory cell is applied for the same duration, but with the opposite polarity, in another phase, before the charge sharing phase. In other words the integrator is charged by one of the positive or negative current components in one phase and then discharged by the other current component in the next phase, so that the accumulated charge represents the differential current contribution, before the current sharing phase. In other embodiments the integrator could be a fully differential integrator configured to receive the positive and negative current components simultaneously during the charging phase.

Figure 5:
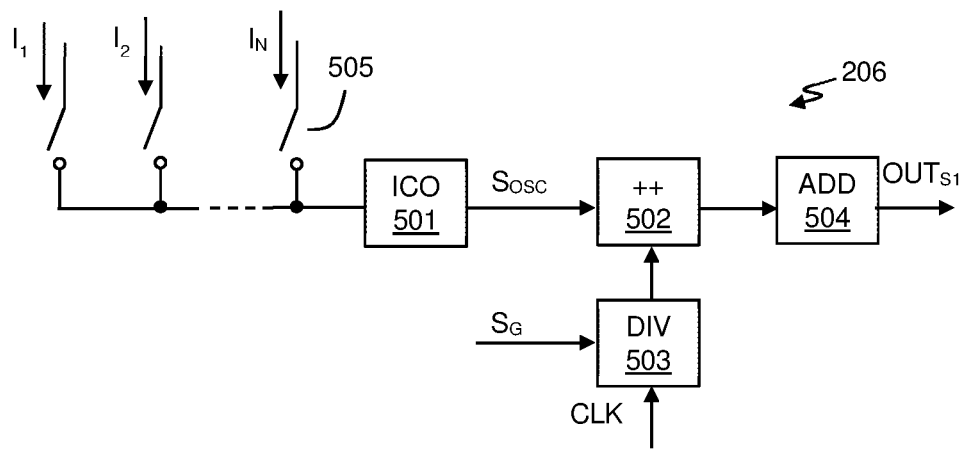
FIG. 5 illustrates a further example of circuitry for a combiner module.

FIG. 5 illustrates a further example of at least part of a combiner module 206 for producing a weighted sum, $OUT_S$, of the cell output signals of the memory cells 201 of a set

205. In this example the output signals from the memory cells 201 of the set, in this example current signals $I_1$ to $I_N$, are applied sequentially to a controlled oscillator 501, in this example a current controller oscillator (ICO) such as a ring oscillator. As would be understood by one skilled in the art the ICO 501 will generate an oscillation signal $S_{OSC}$ with a frequency that depends on the magnitude of the relevant current signal, e.g. $I_1$. The oscillation signal $S_{OSC}$ is supplied to a counter 502 that counts the number of oscillations in the oscillation signal $S_{OSC}$ within a count period defined by a clock signal CLK. The count value depends on the frequency of the oscillation signal and thus the magnitude of the relevant current signal. The count value also depends on the duration of the count period. The effective gain can thus be varied by varying the duration of the count period.

Thus, in a first time period, the first current signal 1, may be supplied to the ICO 501 to generate the oscillation signal $S_{OSC}$ supplied to the counter 502. During the first period the received clock signal, at a frequency f1 say, may be supplied to the counter 502 to define the count period e.g. as 1/f1. In a second time period the next current signal, $I_2$, may be supplied to the ICO501. During this time period a frequency divider 503 may divide the received clock signal by a factor of three to generate a divided clock signal at a frequency f⅓ which is supplied to the counter 502 to define the count period, e.g. as 3/f1. The count period during this second time period is thus three times as long as that for the first time period, and thus the effective gain for the current component $I_{P2}$ is three times that for the current component $I_1$. This process may be repeated for each successive current signal, with the clock signal frequency being divided by a further factor of three each time.

In some embodiments the counter 502 may maintain its count value at the end of one count period and then continue to count from that value during the next count period during which a different current signal is supplied to the ICO 501. In this way the counter accumulates a combined weighted sum value which can be output at the end of all the count periods for the set. In some embodiments however the count value at the end of each count period may be output to an adder 504 and the counter reset, and the adder 504 may store and add the sequential outputs from the counter from successive count periods to provide the weighted sum output $OUT_S$.

It will be noted that the count periods will thus be of different length for each current signal. In some embodiments the duration for which the relevant current signal is supplied to the ICO 501 may correspond to the duration of the count period. For instance the same output from the divider 503 may be used to control the count period of the counter 502 and also the duration for which the relevant current signal $I_1$ to $I_N$ is selected, e.g. by selection switches 505. Thus the first time period during which the current signal $I_1$ is supplied to the ICO 501 may be different from the second time period during which the current signal $I_2$ is supplied to the ICO 501. In some embodiments however the current signals could be supplied for equal time periods, sufficient to allow for the longest count period, with the counter 502 only be operated to count for part of that time period.

It will be noted that it would be possible to provide a count value for each current signal based on the same duration of count period and then process the individual count values in digital processing to implement the gain. However this may involve a reasonable amount of digital processing circuitry with size and power requirements. Dividing a clock frequency by an integer amount to change the count period is relatively easy to implement and thus provides a simple way of providing the effective gain.

It will also be noted that FIG. 5 illustrates an embodiment where the current signals $I_1$ to $I_N$ are supplied sequentially to the same ICO 502 and the division ratio applied to the clock signal changed accordingly. In some embodiments however at least some of the current signals $I_1$ to $I_N$ could be supplied to separate ICOs simultaneously, where each ICO outputs an oscillation signal to a respective counter that receives an appropriately divided version of the clock signal. The adder could then add the outputs from the respective counters. This would allow for simultaneous processing of a set of memory cells, but would require multiple ICOs with a consequential size requirement and different ICOs could exhibit manufacturing and operational variations in use.

Like the other examples discussed above, the positive and negative current components from a set 205 of memory cells 201 could be processed separately by corresponding circuits to produce separate weighted sums for the positive and negative components, or the current components from each memory cell could be combined to a resultant current signal which is used to drive the ICO 501. In some embodiments the positive and negative current components from a memory cell could be supplied to the ICO sequentially, and the counter 502 could be an up/down counter configured to increment (for the relevant count period) when one of the positive or negative current components is used to drive the ICO and decrement (for the same count period) when the other component is used to drive the ICO 501.

The combiner of FIG. 5 thus uses a controlled oscillator to provide read-out or conversion of a signal in an analogue computing circuit, in this instance of a current signal representing a value to a digital value. The use of a controlled oscillator to provide read-out is advantageous, as it avoids the need for large accumulation capacitors or the like. The use of a controlled oscillator to provide read-out for analogue computing circuitry represents a novel aspect of this disclosure, as will be set out in more detail below.

It will be understood that FIGS. 3 to 5 illustrate just some examples of possible combiner modules that could be implemented to generate a suitably weighted combination from a set of memory cells.

Referring back to FIG. 2, the combiner module 206 may thus provide an output signal $OUT_S$ which represents the weighted sum of the cell output signals of the memory cells 201 of the set 205. For the example of FIG. 2, with just one set 205 of memory cells, the output $OUT_S$ thus represents the product of the input data D by the stored multilevel weight value W. In some embodiments, as described above, separate weighted sums may be determined for the positive and negative current components and thus the output $OUT_S$ may itself comprise positive and negative components, e.g. a positive weighted sum $OUT_{PS}$ and a negative weighted sum $OUT_{NS}$, although in other embodiments the combiner module 206 may generate a single value based on the weighted sum of the differential outputs from the memory cells.

It will be understood that the weighted sum is determined for the outputs of the memory cells 201 in the set in response to a given signal level of the data input D.

In some implementations the input data may be received as an analogue signal, for instance for audio applications the input data could be an analogue audio signal, e.g. such as may be generated by a microphone of a device. The received analogue input data may thus be used as the cell input signal. It will be appreciated that in such a case the input data may be time varying. However the rate of change of the input data may be relatively slow compared to the processing time required to determine the weighted sum, i.e. to generate the output $OUT_S$, and thus the input data may be considered to be substantially constant over such a processing period of the circuitry 200. However in some applications it may be beneficial to hold the value of the input data D substantially constant over a processing period required to determine the weighted sum, i.e. the output $OUT_S$, for example with a sample and hold circuit or similar.

In some embodiments however the input data may be received in a digital format. In some applications, digital input data may be converted to a corresponding analogue signal by a suitable DAC, so that the data applied to the computing circuitry 200, i.e. the cell input signal, is analogue, e.g. a suitable voltage $V_D$. In which case the sample rate of the DAC may be configured such that the DAC output is substantially constant over a processing period of the computing circuitry 200 required to determine the output signal $OUT_S$.

Where the data applied to the computing circuitry 200 is analogue, the suitable weighted and combined outputs of the memory cells of one set represents the product of the analogue data D with the multi-digit weight value W stored in that set 205 of memory cells 201. Thus for the example of FIG. 2, with a single set 205 of memory cells, the output $OUT_S$ represents the desired product and the output $OUT_S$ could be provided as an output of the computing circuitry 200.

In some embodiments however the input data may itself be encoded as a multi-digit data value, i.e. as a multi-digit data word, and may be applied to the computing circuitry in such a digital format. In this case, an individual data input may, at a given point in time, be quantised to one of a plurality of predefined data levels to represent a digit, where the different digits of the input data word have a different significance. In such a case the level of any one data input at a given time only represents part of the input data value and it is necessary to take the relevant significance of the digit of the input data into account.

In embodiments of the present disclosure a multi-digit data value may be applied so that a given signal level for the input data represents the value of the digit, and the significance of the digit is implemented by a suitable gain being applied by the computing circuitry.

Conveniently the input data may be encoded in a similar fashion as the multilevel data values, e.g. weight values W, stored in the sets 205 of memory cells 201. That is if a binary encoding were applied to the set(s) of memory cells, such that each memory cell 201 is selectively programmed to one or two different cell states and the gains G1 to GN are binary weighted, the input data may also be binary encoded. As noted above however it may be advantageous, in some embodiments, to implement a ternary encoding for the memory cells of a set, with the gains G1 to GN being ternary weighted so as differ from one another by a factor of three. In this case the input data may also be ternary encoded.

Figure 6:
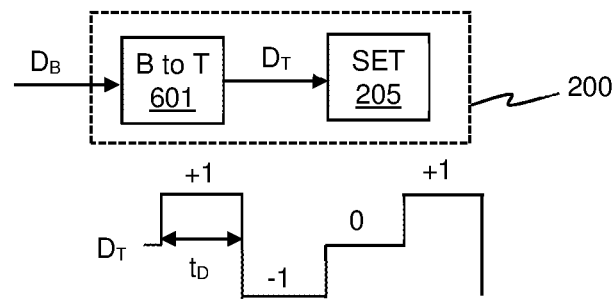
FIG. 6 illustrates binary to ternary conversion.

As noted above, digital data may typically be encoded in a binary format. In embodiments of the present disclosure the computing circuitry 200 may include a binary-to-ternary converter as illustrated in FIG. 6. FIG. 6 illustrates that input binary encoded data $D_B$ may be received by a binary-to-ternary converter 601 and converted to ternary encoded data $D_T$ to be applied to at least one set 205 of memory cells. One skilled in the art would be aware of how to implement a binary-to-ternary converter. FIG. 6 also shows one example of the type of ternary data waveform. In this example a balanced ternary scheme is used with the three possible data values for each digit being +1, 0 and −1, in a similar fashion as described above for the data values for each memory cell 201. It will be understood however that unbalanced schemes, with data values of 0, 1 and 2 could be implemented in some applications. In either case the value of each digit is represented by a defined signal level, e.g. voltage, for a data digit period $t_D$.

In some embodiments at least some of the digits of a multi-digit data value may be applied to a given set 205 of memory cells 201 sequentially, with the computing circuitry being configured to form a weighted sum for each data digit, and to combine the weighted sums for each digit with a gain weighting appropriate for that digit of the input data.

For instance, with reference to FIG. 2, the digits of a multi-digit word could be applied sequentially in a series of data digit periods $t_D$. During each data period the weighted sum of the outputs of the memory cells 201 of the set 205 may be determined as discussed above. To implement the different significance of the input data digits, a scaling factor could be applied to the weighted combinations determined in the different data periods, and then the appropriately scaled weighted sums for each data digit period could be combined.

In some embodiments the different scaling factors for the data digits could be achieved, at least partly, by varying the gains G1 to GN applied to the outputs of each memory cell in the different sample periods. That is, during a first data digit period $t_D$, a first digit of the data value may be applied to the set 205 of memory cells. The voltage $V_D$ applied to the set may thus correspond to the value of that digit. A weighted sum of the outputs of all of the memory cells 201 of the set 205 may be formed with gains G1 to GN being applied as discussed above. In a second data digit period the next digit of the data value may be applied, and another weighted sum generated, but this time with a set of gains G1*GD to GN*GD being applied, where GD is an appropriate scaling factor for the relevant data digit. For ternary encoding as discussed above the scaling factor GD may vary by a factor of three from one digit to the next.

To vary the gains G1 to GN applied during the combination of the outputs from the memory cells 201 of a set 205 in response to a given data digit, the combiner module could comprise circuitry such as discussed with respect to FIG. 4, with the input current to the integrator being provided from the same one or more physical current inputs over successive data digit periods, with the relative scaling factor applied to successive currents defined as before from the ratio of capacitors 402 and 403.

Alternatively, to vary the gains G1 to GN applied during the combination of the outputs from the memory cells 201 of a set 205 in response to a given data digit, the combiner module could comprise circuitry such as illustrated in FIG. 5, with the divide ratio applied by divider 503 being controlled appropriately by the gain control signal $S_G$ to apply an appropriate gain.

Additionally or alternative at least part of the different scaling factors for the data digits could be achieved as part of the combination of the different weighted sums generated by the different data digits. For instance, as illustrated in FIG. 2, the combiner module 206 may comprise at least one gain element 208 which receives, for the successive data digits, the output $OUT_S$ representing the weighted sum of the outputs of the memory cells 201 for that data digit, and which combines the weighted sums together with an appropriate scaling factor GD applied to the weighted sum for each digit to provide an $OUT_{S1}$. For the example of FIG. 2, the output $OUT_{S1}$ thus represents the product of the multi-digit data value supplied as an input, with the multi-digit data value, e.g. weight value, stored by the set 205 of memory cells.

For example consider that there are three memory cells 201 of the set which are programmed to represent ternary data values of −1, 0, +1 respectively with respective gains G1 to G3 applied to the outputs of the memory cell, where G1 is unity, G2=3 and G3=9 (so the first listed value is the least significant digit in this example). It will be appreciated that this corresponds to a stored data value equal to +8. Consider that the input data is three digit ternary encoded data value, with respective digits of say +1, +1, 0 (again with the first listed digit being the least significant digit in this example) so as to represent a data value of +4 encoded by suitable voltage values. In the first data period the voltage corresponding to a data level +1 is applied. The output from each memory cell is thus the product of the input data digit value and the stored digit value, and these outputs are combined with the appropriate gain. The weighted sum for the first period is thus [(+1×−1)×1]+[(+1×0)×3]+[(+1×+1)×9]=+8. During the second time period the voltage for the next data digit is applied, in this case corresponding to +1 again. The weighted sum for this data digit is thus again equal to plus 8, but with a gain GD of 3 applied to the contribution of +24. For the last digit, which in this case is a voltage corresponding to 0, the weighted sum will be equal to zero and thus the gain adjusted weighted sum will also be zero. The overall output from the gain element 208 will thus be a signal $OUT_{S1}$ corresponding to a value of +32, which is the product of the multi-digit data value with the multi-digit weight value.

In one example the combiner module 206 may comprise circuitry such as illustrated in FIG. 3 to form the weighted sum for each of the data digits. As described above, the circuitry illustrated in FIG. 3 can simultaneously combine the outputs from the memory cells of the set 205 and output a corresponding voltage as the output $OUT_S$. In this case the gain element 208 could take the form as illustrated in FIG. 4, however instead of an output current from one of the memory cells being used as an input, the voltage $OUT_S$ representing the weighted sum due to one data digit would be applied to the input capacitor 406 to charge the input capacitor to that voltage level. The input capacitor 406 may then be used to charge the integrator capacitor 402 so as to accumulate an amount of charge on the integrator capacitor 402 that corresponds to the respective weighted sum, before the charge sharing phase is implemented to transfer a defined proportion of charge away. This process is repeated for all of the digits of the multi-digit input, although the charge sharing phase may be omitted for the last digit. In this way the weighted sums due to each of the data digits are combined with appropriate weightings that, in this example, vary by a factor of three. After all the digits of the data value have been applied, the integrator output may be output, e.g. by sample and hold circuit 404 to provide an output OUT.

Applying the different digits of a multi-digit data value in this way thus can allow computation of the product of the multi-digit data value with the stored multi-digit value, e.g. the weight value. However it does require a separate processing period for each separate digit of the multi-digit input data. In some applications processing speed or throughput may be important. In such applications it would be possible to process the different digits of a multi-digit data input in parallel. Thus the different digits of a multi-digit data value of said digital data signal may be applied in parallel to a first plurality of said sets of memory cells, where each set of the first plurality stores the same weight value.

Figure 7:
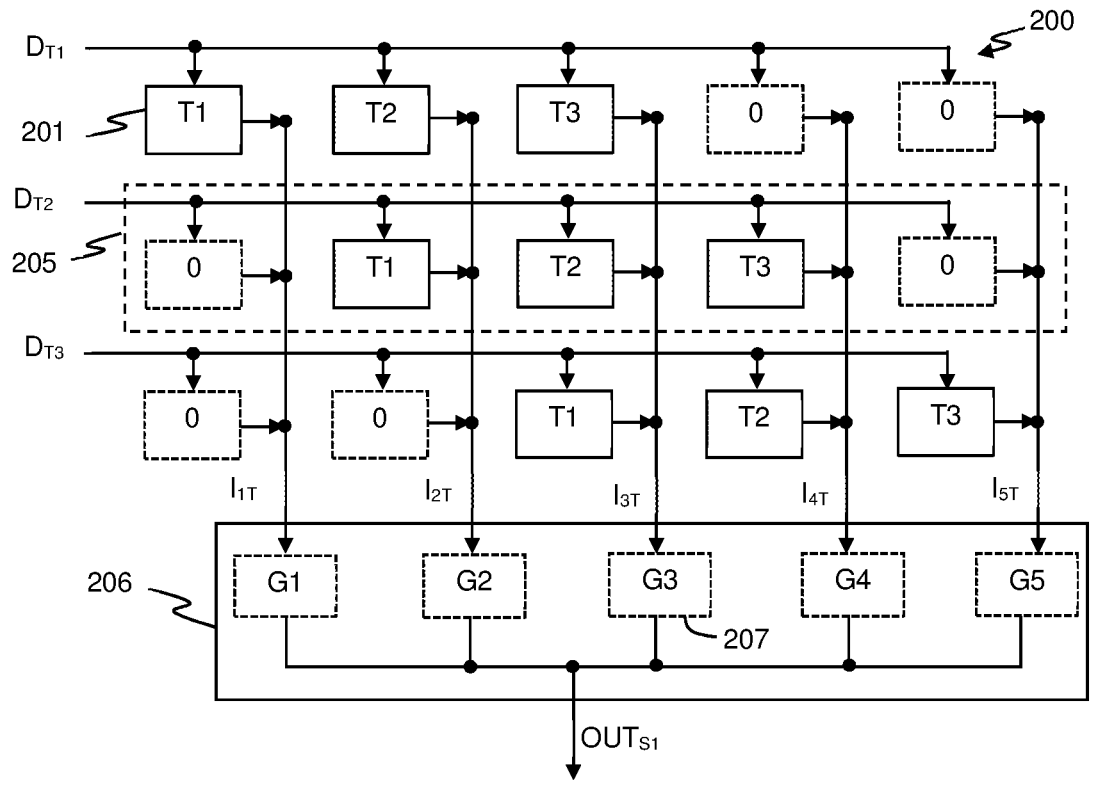
FIG. 7 illustrates an example of computing circuitry for processing digits of a multi-digit data value in parallel.

FIG. 7 illustrates an example of computing circuitry 200 for determining the product of a multi-digit input data value with a stored multi-digit weight value. FIG. 7 illustrates an example where the input data value and stored weight data value both comprise three digits, although it will be understood that the principle may be applied to resolutions other than three digits and it is not necessary for the stored weight value to have the same number of digits as the input data. FIG. 7 an example with three sets 205 of memory cells 201 and each set of memory cells receives a respective one of the input data digits, in this case ternary encoded digits $D_{T1}$ to $D_{T3}$. The sets 205 of memory cells 201 are programmed to store the same stored weight data value, in this case a ternary encoded value of three trits T1 to T3. The least significant input data digit $D_{T1}$ is applied to a set of memory cells, where the first three memory cells 201 are programmed to the relevant weight data values T1 to T3. As illustrated the outputs of these memory cells are supplied to the combiner module 206 where they are combined with appropriate gains G1 to G3 being applied. The next most significant input data digit $D_{T2}$ is applied to a separate set 205 of memory cells which again comprises three memory cells programmed to the relevant weight data values T1 to T3. To ensure that the correct gain is applied for the significance of the input data digit, the output of the memory cell which is programmed to the least significant weight trit value T1, is supplied to the combiner module so that the gain G2 is applied to the contribution. Conveniently therefore the output from the memory cell programmed with the weight digit value T1 in this second set is combined with the output from the memory cell programmed with the weight digit value T2 from the second set. Likewise the outputs from the memory cells programmed with the weight digit values T2 and T3 are supplied to the combiner module 206 so as to be combined with gains of G3 and G4 being applied respectively. The most significant input data digit $D_{T3}$ is applied to a set of memory cells where the respective outputs from the memory cells programmed to T1 to T3 are combined with respective gains of G3 to G5. Thus the scaling factor applied to each of the cell output signals depends on the significance of that memory cell in the stored weight data value and also the significance of the data digit in the multi-digit input data value.

In the example of FIG. 7 each set 205 of memory cells comprises five memory cells 201. This allows the outputs of corresponding memory cells of each set to be combined together with appropriate gains applied to the combined output. Memory cells 201 of a set 205 which are not programmed to store one of the digits of the weight value may be programmed to the zero cell state. In some embodiments however, if the resolution of the weight values is known in advance and will not be changed in use, the unused memory cells in each set could be omitted.

The arrangement illustrated in FIG. 7 thus provides an output $OUT_{S1}$ which represents the product of the multi-digit data value with the stored multi-digit value, e.g. weight value.

The circuitry illustrated in FIGS. 2 and 7 is suitable for computing a single product of an input data value with a stored data, e.g. weight value.

In some applications it may be desirable to determine the products of a plurality of different data values with respective weight values. For instance for implementing an ANN for inference it may be desirable to determine a dot product of an input vector of a plurality of data variable with a vector of respective weights. For example an artificial neuron in an ANN may receive a plurality of data inputs and determine a dot product of the data inputs weighted by respective weight values, with this dot product being subject to some further processing, e.g. according to some non-linear activation function. In some implementations a circuit such as illustrated in FIG. 2 or FIG. 7 could be provided for each data input and weight value to provide a respective product for further processing. However in some embodiments a group of sets 205 of memory cells storing different weight values could be connected together and arranged to receive respective data inputs so that the combiner module 206 generates an output that represents a dot product of the data inputs and the respective weight values. This avoids the need for a separate combiner module 206 for each set of memory cells 205.

Figure 8:
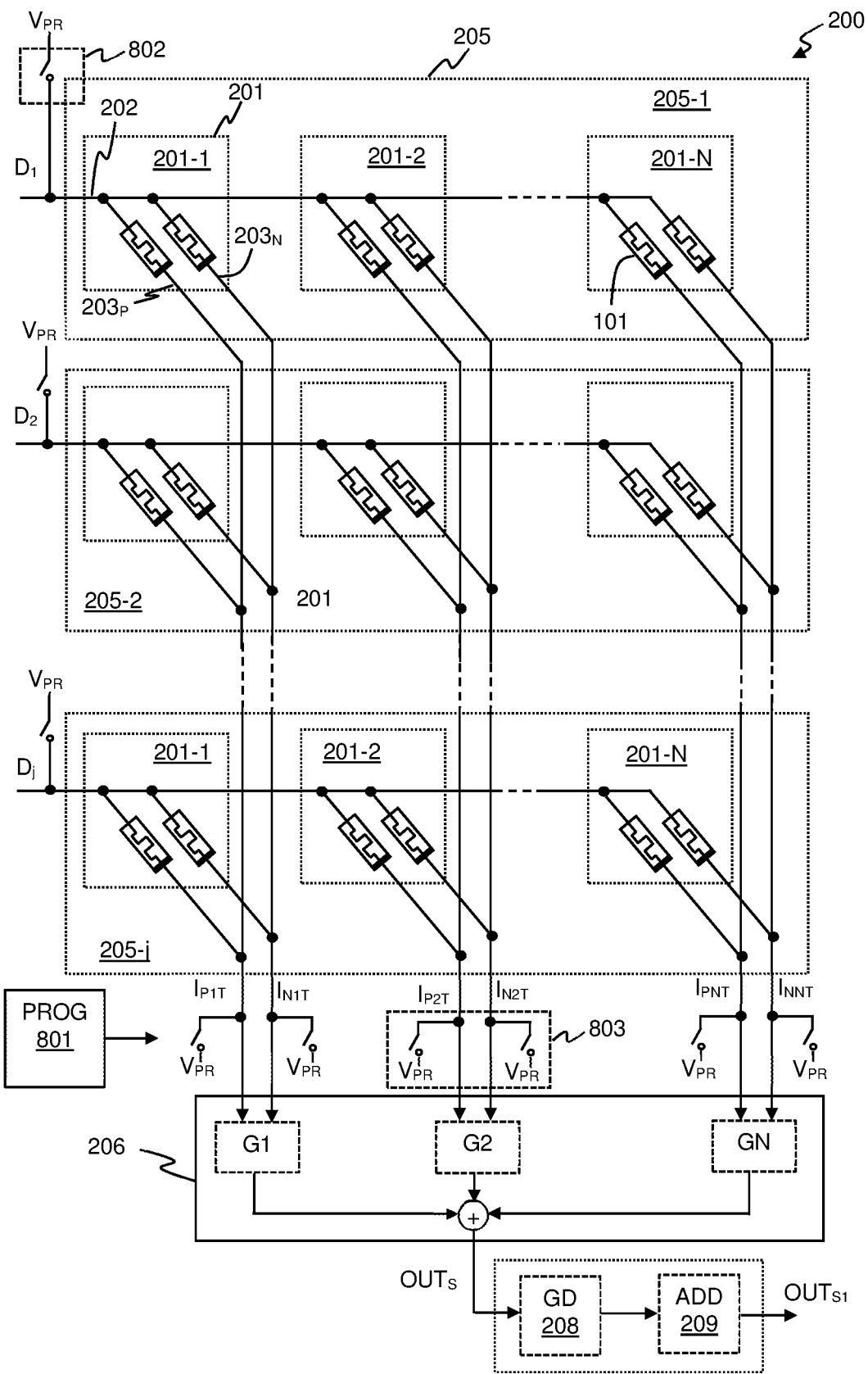
FIG. 8 illustrates another example of computing circuitry according to an embodiment.

FIG. 8 illustrates one example of computing circuitry 200 with a group of connected sets of memory cells. In this example there are a plurality j of data inputs, with each data input $D_1$ to $D_j$ being applied to a respective set 205-1 to 205-j of memory cells. In this example corresponding memory cells 201 of the sets in the group (e.g. the memory cells 201-1 of each set) are coupled together so as to combine their outputs. In the example of FIG. 8 the positive and negative second electrodes $203_P$ and $203_N$ of the corresponding memory cells are coupled to respective common positive and negative electrodes so that the current components from each of the corresponding memory cells are combined together. For instance the first memory cell 201-1 of each of the sets 205-1 to 205-j may be coupled together to provide total positive and negative currents $I_{P1T}$ and $I_{N1T}$ respectively to the combiner module 206, and likewise for the other memory cells of the sets.

The combiner module 206 may operate to combine the total currents from the connected memory cells with appropriate gains as described above. For instance the combiner module could operate as described with reference to any of FIGS. 3 to 5, but the current inputs $I_1$ to $I_N$ may represent the total currents from all the corresponding memory cells of the set, e.g. the positive current components $I_{P1T}$ to $I_{PNT}$ or the native current components $I_{N1T}$ to $I_{NNT}$ or some respective combined signal.

If the data inputs $D_1$ to $D_j$ represent separate input data variables which are to be multiplied by different weight values, each set 205 of memory cells 201 could be programmed to store a respective multi-digit weight value, with the memory cells of the sets that correspond to the same significance having their outputs connected together. That is the memory cells 201-1 of each set, to which the lowest effective gain G1 is applied may be programmed to represent the least significant digit of each set 205, with the memory cells 201-2 being programmed to represent the next most significant digit and so on. The data inputs may be analogue, as discussed above, or could be multi-digit data values with different digits applied sequentially and an appropriate digit gain GD applied as discussed above. Alternatively some of the data inputs could correspond to different digits of a multi-digit data value that are applied in parallel, in which case the memory cells of the relevant sets could be programmed as discussed above in relation to FIG. 7.

The sets 205 of memory cells 201 thus operate to both act as a memory for storing the weight values but also form part of the computing circuitry. This can allow for relatively low power and/or low latency operation and can be relatively efficient in terms of circuit area.

In order to programme suitable data values in the memory cells, a programming controller 801 may be configured, in a write mode of operation, to control the application of suitable programming pulses to the memory cells 201. To be able to program the individual memristors of a memory cell 201 it is desirable to able to control the voltage across that individual memristor to a desired level, whilst ensuring that a programming threshold is not inadvertently applied to an unintended memristor. In the example of FIG. 8 the programming may be performed by controlling voltage applied to the first electrodes 202 of the memory cells and to the positive and negative electrodes $203_P$ and $203_N$ of the memory cells to apply a desired resultant voltage across the memristors to be programmed. In this example a programming voltage $V_{PR}$ may be selectively applied to first electrode 202 of a set of memory cell to programme that set of memory cells, with appropriate voltages applied to the positive and negative electrodes $203_P$ and $203_N$ of the memory cells of that set to programme them to the selected cell states. In some embodiments there may be a programming switch 802 coupled to each first electrode 202 for selectively coupling the first electrode to a suitable programming voltage $V_{PR}$, which may be controllably selected to be a positive or negative voltage depending on the programming required, although in some embodiments a suitable programming voltage could be applied to the first electrode via other components coupled to the first electrode, such as a DAC for generating a data voltage $V_D$ in use. Programming switches 803 may be provided to couple the common positive and negative electrodes to suitable programming voltages. To ensure the memristors of the correct set are programmed, the first electrodes of the other sets may be controlled to some voltage which means the resultant voltage across the memristors of the other sets is insufficient to programme the memristors.

The circuitry 200 of FIG. 8 could form at least part of an artificial neuron of an ANN, in which case the output $OUT_S$ (or $OUT_{S1}$ if appropriate) may be processed according to a non-linear activation function, e.g. by some downstream processing module.

In some embodiments, for instances to implement a layer of an ANN, it may be wished to form the dot product of the same vector of input data variable with a plurality of different vectors of weights. In which case there may be a plurality of sets 205 of memory cells arranged to receive the same data inputs.

Figure 9:
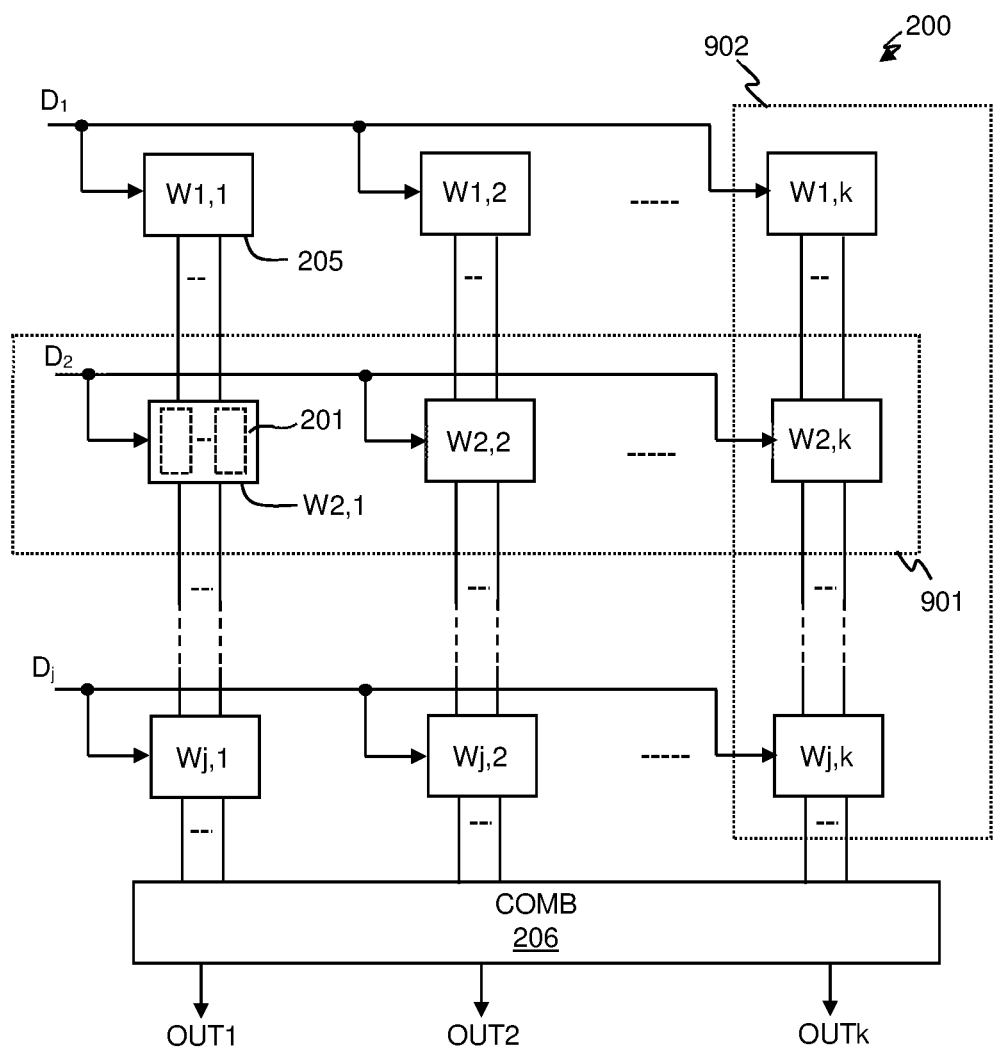
FIG. 9 illustrates an example of a processing array.

FIG. 9 illustrates one example of a computing circuit 200 having a plurality of sets of memory cells arranged in a crossbar array type arrangement. In FIG. 9 similar components to those described previously are identified by the same reference numerals.

FIG. 9 illustrates an array comprising a plurality of rows 901 and columns 902, in this instance a number of rows equal to j and a number of columns equal to k. In this example the number of rows correspond to the number of possible data inputs to the array and the number of columns corresponds to number of possible data outputs from the array. It should be understood however that the terms rows and columns are used for convenience only for the illustration of FIG. 9 and other arrangements are possible. In this example each column 902 is configured to generate a signal corresponding to the combination of the product of each of the inputs $D_1$ to $D_j$ with a corresponding weight value, i.e. W1,m to Wj,m for the mth column. The columns, in this example, thus represent groups of sets, where the set output from each set in the group is combined with the others to form a group dot product output ΣDi·Wi,m (as a differential current signal) which is processed by the accumulator to provide a respective accumulator output OUTm (e.g.

OUT1). There are a plurality of groups (equal to the number of row elements) to allow for the data inputs to be processed with different weight values.

In this example, each column thus comprises a group of j sets of memory cells for storing and outputting the multi-level weight values. Each set 205 of memory cells may comprise a number N of memory cells 201. Corresponding memory cells of the different sets have their outputs connected together as described previously. The outputs from the memory cells of a group 902 of sets are provided to combiner module 206 which may generate a combined dot product value for each group of sets, e.g. OUT1, OUT2 etc.

In some embodiments the circuitry 200 may be operated so that all the groups 902 of sets receive data simultaneously and provide outputs to the combiner module 206. In which case the combiner module may comprise combiner circuits for each of the groups of set, i.e. for each column. In some embodiments, however, at least some columns of the array, e.g. groups of sets, could be operated on a time-division basis such that different columns could be operated at different times. In which case the same combiner circuits may be used for the different columns in a time division manner to generate the outputs OUT1, OUT2 etc. The matrix array 200 of FIG. 9 can thus process up to j data inputs with a j by k matrix of multilevel weight values to provide k outputs, each output corresponding to a weighted combination of the data inputs.

The discussion above has focussed on the input data being applied to a set of memory cells as a voltage, or current, where the instantaneous level of the voltage or current varies with the level of the input data. In some embodiments however the data could be applied as a time modulation so as to control the average voltage or current over a time period.

For example FIG. 10 illustrates computing circuitry 200 in which a defined input, in this example a reference voltage V but the input is modulated. In this example each of the memory cells 201 of the set 205 is connected to receive the input voltage V via a respective switch 1001. Each of the switches 1001 is controlled to apply a time encoding modulation based on the input data D. For instance a pulse-width modulation (PWM) encoding may be used so that the memory cell is connected to receive the reference voltage for a first period of a PWM cycle period, where the duration of the first period is determined by the input data value. For the rest of PWM cycle period, i.e. during a second period, the memory cell may be disconnected from the input voltage V. During the first period the current output from the memory cell 201 will depend on the cell state of the memory cell, and hence the stored weight digit value, and also the defined input voltage. During the second period no current will flow. The average current output from the memory cell over the PWM cycle period is thus proportional to the duty cycle and hence the input data value. This allow the use of a fixed reference voltage and encodes the data by PWM encoding.

It will be noted that modulating the input voltage in this way allows the input to the memory cell to be modulated according to the magnitude of the input data, however modulating the input voltage in this way does not allow for data of different polarity to be applied. To allow for data of different polarity the circuit may comprise switches 1002, either in addition to or instead of the switches 1001. The switches 1002 may be capable of swapping the positive and negative outputs $I_P$ and $I_N$ of the memory cell 201 depending on the sign of the data. As the output of the memory cell is encoded by the differential current signal, i.e. $\Delta I = I_P - I_N$, swapping the outputs $I_P$ and $I_N$ effectively changes the polarity of the output. If switches 1002 are present, the PWM modulation could also be applied at the output of the memory cell 201 thus avoiding the need for switches 901 for modulation.

However the modulation is applied, the output of each memory cell 201 would be a current signal where the average current over the PWM cycle period is proportional to the stored value for the memory cell and the relevant input data. This output from the memory cells of the set could be combined into a weighted sum over the PWM cycle period by a combiner module such as illustrated in FIG. 4 for example by charging the input capacitor 406 over the PWM cycle period.

The discussion above has focussed on the use of a pair of memristors for each memory cell, where each memristor may be programmed to one of two different resistance levels to provide current steering. In general the memory cell has a common input, i.e. the first electrode 202, for receiving a defined input current, and first and second paths allowing current to flow from the common input to respective first and second cell outputs, i.e. the positive and negative second electrodes $203_P$ and $203_N$. In the examples described, respective memristors are located in each of the first and second paths and programmed to a desired resistance state to provide desired current steering to the positive and negative output to represent a desired value. As discussed above, with memristors that can be programmed to one of two different resistance states, the memory cell can be programmed to a first cell state or a second cell state to preferentially steer current to one output or the other, e.g. to provide +1 and −1 cell states. For binary encoding, each memory cell may be programmed to one of the first or second cell states. To allow for ternary encoding the memristors in each path could be programmed to the same resistance state, i.e. the third cell state or fourth cell state, so as to steer current equally to the positive and negative outputs of the cell.

Such an arrangement can provide the functionality of memory and processing in use with a relatively small area. The use of the same type of memristors in each of the first and second paths and a differential current output allow for balanced ternary encoding and outputs of positive or negative polarity.

It will be appreciated however that any mismatch between the resistance states of the memristors of one memory cell compared to another memory cell may result in a mismatch in the current steering provided by those memory cells. If the values of the high resistance state $R_H$ and/or the low resistance state $R_L$ for the memristors vary from one memory cell to another, the differential current in response to a given data input may vary between the memory cells, which may introduce an error between memory cells. In particular the memory cells may be sensitive to any variations in the resistance $R_L$ of the low resistance state.

In some implementations any variation between the various memristors may be sufficiently low for the accuracy required. In some embodiments however it may be desirable to reduce the sensitivity to any part-to-part variations in memristor resistance. In some embodiments therefore each of the memristors 204 of a memory cell may be connected in series with an additional resistance, e.g. a suitable resistor.

For example, FIG. 11a illustrates an example of a memory cell where a respective resistance 1101, which may be seen as a ballast resistance with a resistance value $R_B$, is connected in series with the respective memristor 204 in each of the first path between the first electrode 202 and the positive second electrode $203_P$ and the second path between the first electrode 202 and the negative second electrode $203_N$. In this case the resistance of the first path, or the second path, when the respective memristor is in the high resistance state will be $R_H+R_B$ and will be $R_L+R_B$ when the respective memristor is in the low resistance state. The resistance $R_B$ may advantageously be chosen to be greater than $R_L$ but lower than $R_H$ so that the resistance of a path when the relevant memristor is in the low resistance state is dominated by $R_B$ but the resistance of the memristor in the high resistance state is greater. The effect of such a ballast resistance is to reduce the sensitivity of the memory cells to any variation in the resistances of the memristor states, in particular any variation in the resistance of the low resistance state.

Figure 11C:
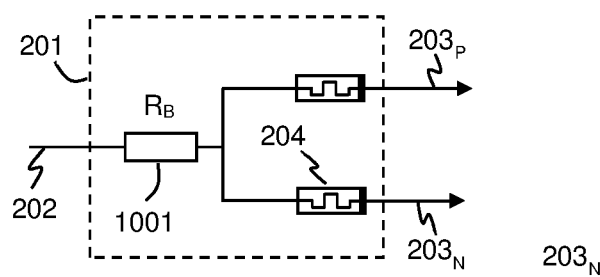

FIG. 11a illustrates that the resistance 1101 is on the output side of the memristor 204 in the respective path, but equally, in one or both paths, the resistance 1101 could be connected on the input side, as illustrated in FIG. 11b. Additionally or alternatively a resistance 1101 could be shared between the first and second paths as illustrated in FIG. 11c, which may reduce the number of components required and allow for a memory cell to have a small size. In the example of FIG. 11c the resistance 1101 is located in a common path, with the first and second paths, with their respective memristors, branching from the common path to the relevant second electrodes $203_P$ and $203_N$. It will be understood however that FIGS. 11a to 11c illustrate just three examples and many other arrangements are possible and may be implemented.

It will be understood that other arrangements may be possible and that the current steering depends on the overall resistance/conductance of the first and second paths through the memory cell. In some embodiments at least one of the first or second paths may comprise multiple programmable elements, e.g. multiple memristors in a desired configuration so as to allow the path to be programmed to the desired resistance/conductance values, in which case there may be a fixed resistance in the other path. This may implement a non-balanced ternary scheme with the memory cell being programmable so that the resistance of the first and second path may be equal to represent a data 0 state, or the first path can take any of two other different resistance values to steer current in a desired ratio to implement a data +1 and a data +2 state. In some embodiments, memristors in the first and second paths may additionally or alternatively be programmable to other values of resistance so as to provide current steering in other ratios.

Embodiments thus relate to computing circuitry comprising memory cells configured to receive a defined input in use and having first and second paths for steering the input current to a positive output or a negative output respectively. At least one of the paths may include a memristor which can be programmed to a selected state to implement a desired ratio of current steering to the positive output and negative outputs. Such memory cells may be arranged or configurable in sets of a number N memory cells. Each memory cell may be programmed to store an individual digit of an N digit weight value stored by the set. In some embodiments the sets of memory cells may be ternary encoded. The outputs from the various memory cells of a set may be received by a combiner module and combined with appropriate scaling factors or gains applied to the contribution from each of the memory cells of a set. The defined input to the set, or the output from the set, may be controlled based on an input data value. The combined currents from all the memory cells of a set may thus represent the product of the input data value and the stored N digit weight value.

In some embodiments the input data may be applied as a multi-digit data value, with one digit being applied to one set of memory cells at a time. In some embodiments different digits of a multi-digit input data value may be applied to the same set sequentially or to different sets in parallel, and the resultant set outputs combined with a scaling factor applied based on the significance of the data digit.

The outputs from a plurality of sets may be combined to form a dot product of a vector of input data variables with a respective vector of weight values. Such a computing array may form at least part of an ANN.

Computing circuitry according to the present embodiments may be relatively low power. Because of the ability for parallel processing of data without the need for multiple memory reads and memory writes the computing circuitry may be operable with relatively low latency, which may be particularly suitable for some applications, such as speech or speaker recognition for example.

Figure 12:
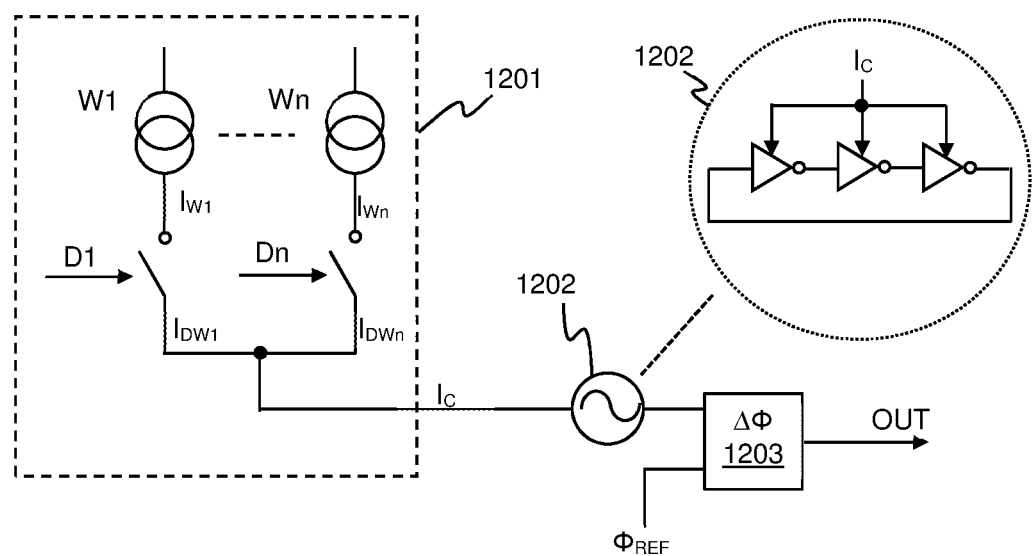
FIG. 12 illustrates an example of a read-out using a controlled oscillator.

As discussed above in relation to FIG. 5, a novel aspect of this disclosure relates to use of a controlled oscillator to provide read out for an analogue computing circuit. FIG. 12 illustrates the principle of using a controlled oscillator. FIG. 12 illustrates an analogue computation block 1201 that performs a calculation based on at least a first data value, e.g. some input data value(s), and at least a second data value, e.g. respective weight value(s), and generates a computation output signal, in this example an output current $I_C$ indicative of the required computation.

In this example, the computation block generates a plurality of currents $I_{DW1}$ to $I_{DWn}$, indicative of the product of a respective weight value W1 to Wn with a respective data value $D_1$ to Dn, and combines these currents to generate the combined output current $I_C$. The output current $I_C$ thus represents the dot-product of the vector of weights W1 to Wn with the vector of data values D1 to Dn. In the example of FIG. 12, a plurality of n current sources are configured to provide respective currents $I_{W1}$ to $I_{Wn}$ indicative of the desired weight values W1 to Wn. Each weight current is modulated, in this example by PWM control of a switch according to a respective input data value D1 to Dn. This means that combined current $I_C$ will have a magnitude that varies over the course of the PWM cycle with the contributions from the individual currents, but the average value of the current over the PWM cycle corresponds to the desired dot-product value.

The desired dot-product value thus corresponds to the average or integral magnitude of the computation output signal $I_C$ over the course of one or more cycle periods.

In this example, to provide read-out of the desired value, the output current $I_C$ from the computation block 1202 is supplied to controlled oscillator 1202. The controlled oscillator has an oscillation frequency that varies with the magnitude of the current $I_C$. In some examples, as illustrated in FIG. 12, controlled oscillator 1202 may be a ring-oscillator comprising series connected inverters as would be understood by one skilled in the art.

Over the course of the PWM cycle, the frequency of the oscillator 1202 varies with the magnitude of the current. The oscillation signal output from the controlled oscillator can be monitored to provide an indication of the integral of the input signal, over the course of one or more PWM periods. The phase of the controlled oscillator corresponds to the integral of the input current and thus, in the example of FIG. 12, the output of the oscillator 1202 is provided to a phase extract block 1203, as will be understood by one skilled in the art. The phase extract block receives the output of the controlled oscillator 1202 and a reference phase signal $\phi_{REF}$ and determines a phase value over the course of a sampling period, that corresponds to one or more PWM periods. The phase value can be output as a digital value, OUT, that corresponds to the desired dot-product.

Previously, to integrate over the course of the PWM cycle(s), it has been proposed to supply the output current to an accumulation capacitor to integrate the charge over the PWM cycle(s). The charge stored on the capacitor can then be sampled. This approach does however typically require the use of a relatively large accumulation capacitor, which takes up circuit area.

A controlled oscillator 1202 and phase extract circuit can be implanted as a small and relatively low power circuit arrangement.

Whilst a phase extract block can be used to provide to determine the output value OUT, in some instances the phase extract block could be implemented as a counter that counts the number of oscillations of the controlled oscillator in a count period that corresponds to one or more PWM periods.

In some examples, if the output of the computation block were instead a signal where the instantaneous value of the current, i.e. the instantaneous current magnitude, represented the desired value (rather than the average value of the current), then the frequency of the oscillation signal from the controlled oscillator 1202 could be directly used to provide the output value and the phase extract block 1203 could be a frequency extract block such as a counter that receives a reference clock signal.

The same principles could be applied to read-out of voltage signals, using a suitable voltage controlled oscillator.

Whilst the controlled oscillator may be conveniently implemented as a ring-oscillator, any type of controlled oscillator with a frequency that varies with the input signal may be used, for instance a self-oscillating time-encoding modulator such as an asynchronous delta-sigma modulator (ASDM) or similar may be used in some implementations.

The use of a controlled oscillator for advantageous read-out for analogue computing circuitry thus represents an aspect of the disclosure. For the avoidance of doubt, this aspect may be implemented with any analogue computing circuitry which may or may not include ternary weighting and combination as discussed above with respect to the other figures.

Figure 13:
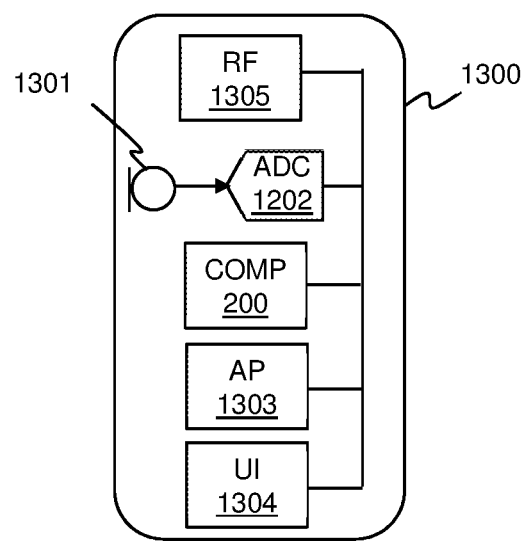
FIG. 13 illustrates a device including computing circuitry.

Computing circuitry according to embodiments may be implemented in an electronic device. FIG. 13 illustrates an electronic device 1300 comprising a computing circuit 200 such as described above. The electronic device may be a portable or battery powered device, for instance a tablet or laptop computer, or smartphone or smartwatch or the like, or a communications interface device such as a smart speaker or other smart listening device. The device may, in some instance, be a voice controlled or voice activated device. The device could be a domestic appliance. The device may have a microphone 1301 and an ADC 1302. In some instances the computing circuit may be operable to process audio data received via the microphone, e.g. for speech and/or speaker recognition. The device may comprise an applications processor (AP) 1303 and in some implementations the computing circuitry may be operable to process data received from the AP and/or to provide data to the AP. In some instances the operation of the computing circuit 200 may be configured by the AP 1303 in use. The device may have at least one other user interface 1304, e.g. for allowing text input and in some applications the computing circuit 200 may be operable to process data received via the UI 1304. The electronic device may also comprise an RF unit 1305 for sending and receiving data wirelessly, e.g. via WiFi™ or Bluetooth™. The computing circuitry 200 may be operable to process data received via the RF unit 1305 and/or to provide data to the RF unit 1305 for broadcast. In some embodiments the weight values to be stored in the memory cells may be received or updated via the RF unit 1305.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Computing circuitry for neuromorphic computing comprising:
   a plurality of memory cells, each memory cell comprising:
      an input electrode for receiving a cell input signal;
      an output for outputting a cell output signal;
      first and second paths connecting the input electrode to the output so that the cell output signal, in use, depends on a differential current between the first and second paths due to the cell input signal, wherein the memory cell comprises at least one programmable-resistance memory element in each of the first and second paths, wherein each memory cell is controllable by selective programming of the programmable-resistance memory elements of that memory cell to store a data digit that can take any of at least three different values;
   wherein the plurality of memory cells are configured into one or more sets of memory cells,
   a combiner module configured to receive the cell output signals from each of the memory cells in at least one set and to combine the cell output signals with a different scaling factor applied to each of the cell output signals.

2. Computing circuitry as claimed in claim 1 wherein the programmable-resistance memory elements comprise memristors.

3. Computing circuitry as claimed in claim 1 wherein the different scaling factor applied to each of the cell output signals of a set differ from one another by a factor of three.

4. Computing circuitry as claimed in claim 1 further comprising a programming controller for controlling programming of the plurality of memory cells, wherein the programming controller is configured to programme the memory cells of a set according to a ternary coding scheme and wherein the combiner module is configured to combine the cell output signals such that scaling factors applied to each of the cell output signals of a said set of memory cells are ternary weighted.

5. Computing circuitry as claimed in claim 4 wherein said at least one programmable-resistance memory element comprises a first programmable-resistance memory element in the first path and a second programmable-resistance memory element in the second cell path and wherein the programming controller is configured to programme the memory cells to any of:
   a first cell state, in which the first programmable-resistance memory element is programmed to a low resistance state and the second programmable-resistance memory element is programmed to a high resistance state;
   a second cell state, in which the first programmable-resistance memory element is programmed to the high resistance state and the second programmable-resistance memory element is programmed to the low resistance state; or
   a third cell state, in which both the first and second programmable-resistance memory elements are programmed to the same one of either the low resistance state or the high resistance state.

6. Computing circuitry as claimed in claim 1 wherein the combiner module comprises a resistor ladder arrangement comprising a plurality of rungs, each rung having an input node configured to receive a current signal comprising the cell output signal of one of the memory cells of a said set of memory cells and also a current contribution from any preceding rungs and configured such that a defined proportion of the total current at the input node flows to the input node of the successive rung to provide said different scaling factors.

7. Computing circuitry as claimed in claim 6 comprising a transimpedance amplifier configured to receive an output of the resistor ladder arrangement.

8. Computing circuitry as claimed in claim 1 wherein the combiner module comprises an integrator having an integrator capacitor, wherein the integrator is configured to operate in a sequence of phase comprising a plurality of charging phases in which the integrator is configured to receive a current signal comprising the cell output signal of a different one of the memory cells of a said set of memory cells to accumulate charge on the integrator capacitor, and a plurality of charge sharing phases in which the integrator capacitor is connected in parallel with a charge sharing capacitor to transfer a defined proportion of charge away from the integrator capacitor to provide said different scaling factors.

9. Computing circuitry as claimed in claim 1 wherein the combiner module comprises at least one controlled oscillator configured to receive inputs comprising the cell output signals of the memory cells of a said one of the sets and counter configured to count a number of oscillations in an output of the controlled oscillator in a count period, wherein the combiner module is configured to apply different count periods for the different memory cells to provide said different scaling factors.

10. Computing circuitry as claimed in claim 1 configured such that the cell input signal for each cell of a said set of memory cells comprises an analogue data signal.

11. Computing circuitry as claimed in claim 1 configured such that the cell input signal for each cell of a said set of memory cells comprises a digital data signal, where the signal level of the digital data signal quantised to one of a plurality of predefined data levels to represent a data digit value.

12. Computing circuitry as claimed in claim 11 wherein said digital data signal is ternary encoded.

13. Computing circuitry as claimed in claim 12 comprising a converter for receiving input data in a first digital format and converting said input data to said ternary encoded digital data signal.

14. Computing circuitry as claimed in claim 12 wherein the computing circuitry is configured such that digits of a multi-digit data value of said digital data signal are applied sequentially to a said set of memory cells as the cell input signal and the combiner is configured to combine the cell output signals to form a weighted sum for each data digit, and to combine the weighted sums for each data digit with a different gain weighting for each data digit.

15. Computing circuitry as claimed in claim 12 comprising a plurality of said sets of memory cells, wherein the computing circuitry is configured such that different digits of a multi-digit data value of said digital data signal are applied in parallel to a first plurality of said sets of memory cells, each of said first plurality of said sets of memory cells being programmed to store the same value, and wherein the combiner is configured to combine the cell outputs from the memory cells of the first plurality of sets with a scaling factor applied to each of the cell output signals that depends on the significance of the memory cell in the stored data value and the significance of the data digit in the multi-digit data value.

16. Computing circuitry as claimed in claim 1 comprising at least one group of a plurality of said sets of memory cells;
wherein, for each of said sets in a said group, a respective cell input signal is applied to the memory cells of the set; and
wherein the plurality of sets of memory cells in a group are connected so that the combiner module receives a combined cell output signal from corresponding memory cells of each of the sets in said group.

17. Computing circuitry as claimed in claim 16 comprising a plurality of said groups, wherein the computing circuity is configured such that, each of said sets of the group has a corresponding set in each of the other groups and the cell input signals applied to each corresponding set is based on the same input data value.

18. A computing apparatus comprising:
a plurality of memory cells, each memory cell comprising first and second programmable-resistance memory element for collectively storing a data digit and outputting a cell output signal proportional to the stored digit for that memory cell wherein the data digit may take any of at least three different values;
wherein the plurality of memory cells are configured into at least one set for storing a multi-digit data value; and
a combiner module for receiving the cell output signals from the memory cells of the at least one set and combining the cell outputs from each memory cell with a predetermined scaling factor.

19. An analogue computing apparatus comprising:
a computation block configured to perform a calculation based on at least a first data value and at least a second data value and generates a computation output signal with a current or voltage indicative of the calculation;
a controlled oscillator configured to receive the computation output signal and generate an oscillation signal with a frequency that varies with the computation output signal; and
an extract block that determines an output value based on the phase or frequency of the oscillation signal.

20. An analogue computing apparatus as claimed in claim 19 wherein the computation output signal has a magnitude that varies over the course of a cycle period so that an average magnitude over the cycle period is indicative of the calculation and wherein the extract block is a phase extract module that determines an output value based on the phase of the oscillation signal.

* * * * *